US006967545B2

(12) United States Patent
Abramov

(10) Patent No.: US 6,967,545 B2
(45) Date of Patent: Nov. 22, 2005

(54) SAW WAVE-GUIDES

(76) Inventor: Yuri Abramov, 24/4 Har Hatzofim St., Holon (IL) 58492

( * ) Notice: Subject to any disclaimer, the term of this patent is extended or adjusted under 35 U.S.C. 154(b) by 58 days.

(21) Appl. No.: 10/432,837

(22) PCT Filed: Nov. 29, 2001

(86) PCT No.: PCT/IL01/01107

§ 371 (c)(1),
(2), (4) Date: Nov. 10, 2003

(87) PCT Pub. No.: WO02/43462

PCT Pub. Date: Jun. 6, 2002

(65) Prior Publication Data

US 2004/0096139 A1    May 20, 2004

Related U.S. Application Data

(60) Provisional application No. 60/253,829, filed on Nov. 29, 2000.

(51) Int. Cl.[7] .............................. H03H 9/64; H03H 9/42
(52) U.S. Cl. ...................... 333/193; 333/150; 333/154; 333/195; 333/196; 310/313 B; 310/313 D
(58) Field of Search ................................ 333/193–196, 333/150–154; 310/313 R, 313 B, 313 C, 310/313 D

(56) References Cited

U.S. PATENT DOCUMENTS

| | | | |
|---|---|---|---|
| 4,350,963 A * | 9/1982 | Iwamoto et al. | 333/151 |
| 5,111,168 A | 5/1992 | Panasik et al. | 333/152 |
| 5,999,068 A | 12/1999 | Tsutsumi et al. | 333/193 |
| 6,011,344 A | 1/2000 | Dufilie et al. | 310/313 B |
| 6,057,630 A | 5/2000 | Yanagihara et al. | 310/313 B |
| 6,114,927 A | 9/2000 | Matsuda et al. | 333/195 |
| 6,577,210 B1 * | 6/2003 | Tsutsumi et al. | 333/195 |

OTHER PUBLICATIONS

David P. Morgan, "Chapter 4: Analysis of Interdigital Transducers",—book "Surface-Wave Devices For Signal Processing", Elsevier Science Publishers B.V., 1985, pp. 57-105.
David P. Morgan, "Chapter 5: The Multi-Strip Coupler and Its Applications",—book "Surface-Wave Devices For Signal Processing", Elsevier Science Publishers B.V., 1985, pp. 107-127.

(Continued)

Primary Examiner—Barbara Summons
(74) Attorney, Agent, or Firm—Edward Langer; Shiboleth, Yisraeli, Roberts, Zisman & Co.

(57) ABSTRACT

Surface acoustic wave (SAW) zebra-wave-guide (10) implemented as an array of interdigitized electrode fingers, wherein the array has internal inter-finger connectors (18) providing inside electrical shorting of part of fingers (16) remaining other fingers (14) to be isolated, moreover, the array (12) is bordered by important free surface spaces (15). Time delay and phase of the propagating SAW beam front are controlled by the varying of quantity of isolated fingers (14) of the zebra-wave-guide (10). Aggregation (40) of the parallel zebra-wave-guides having different quantities of isolated fingers (14) and different widths allows manipulations with narrow SAW beams' phases and magnitudes, that becomes helpful degree of freedom for desire transformation of the SAW beam (140). Aggregation (890) of bi-directional inter-digital transducer (IDT), U-type 3 dB MSC (85), pair of zebra-wave-guides (10 and 11) with different quantity of isolated fingers and IDT-wave-guide (847) represents a partially-unidirectional-combined-IDT (890), that may be utilized for a miniaturized low loss SAW filter design (800).

37 Claims, 25 Drawing Sheets

OTHER PUBLICATIONS

F.G. Marshall, C.O. Newtonand E.G. Paige, "SAW Multistrip Components and Their Applications"—IEEE Transactions on Sonics and Ultrasonics, vol. SU-20, No. 2, Apr. 1973 pp. 134-143.

T.I. Browning, F.G. Marshall, "Compact 130 Microsec SAW Delay Line Using Improved MSC Reflecting Transchangers"—IEEE Ultrasonic Symp., 1974, pp 189-192.

Plessky V.P., Kondratiev S.N., Stierlin R. and Nyffeler F. "SAW tags. New Ideas"—IEEE Ultrasonics Symposium—1995, vol. 1 Nov., 1995 pp. 117-120.

* cited by examiner

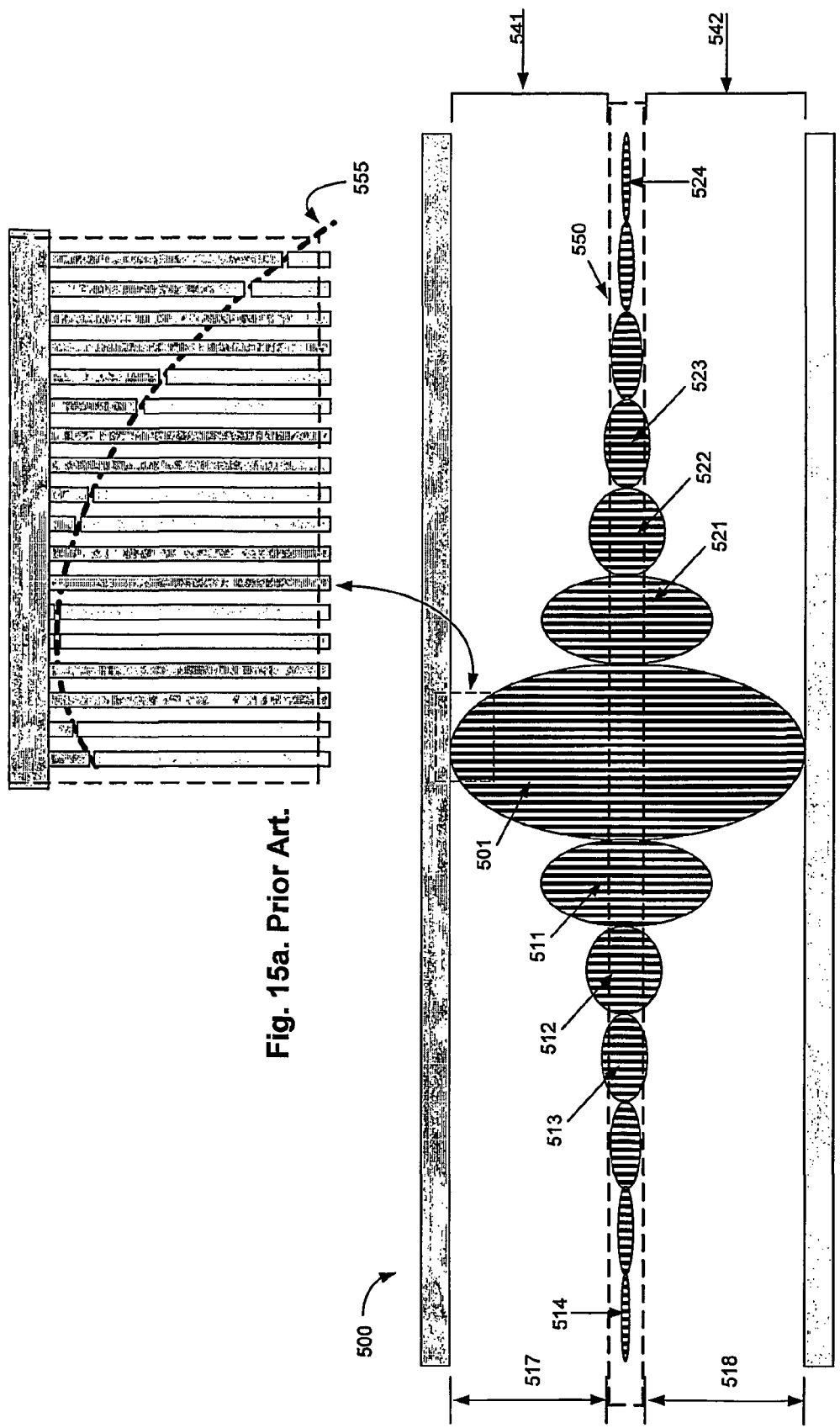

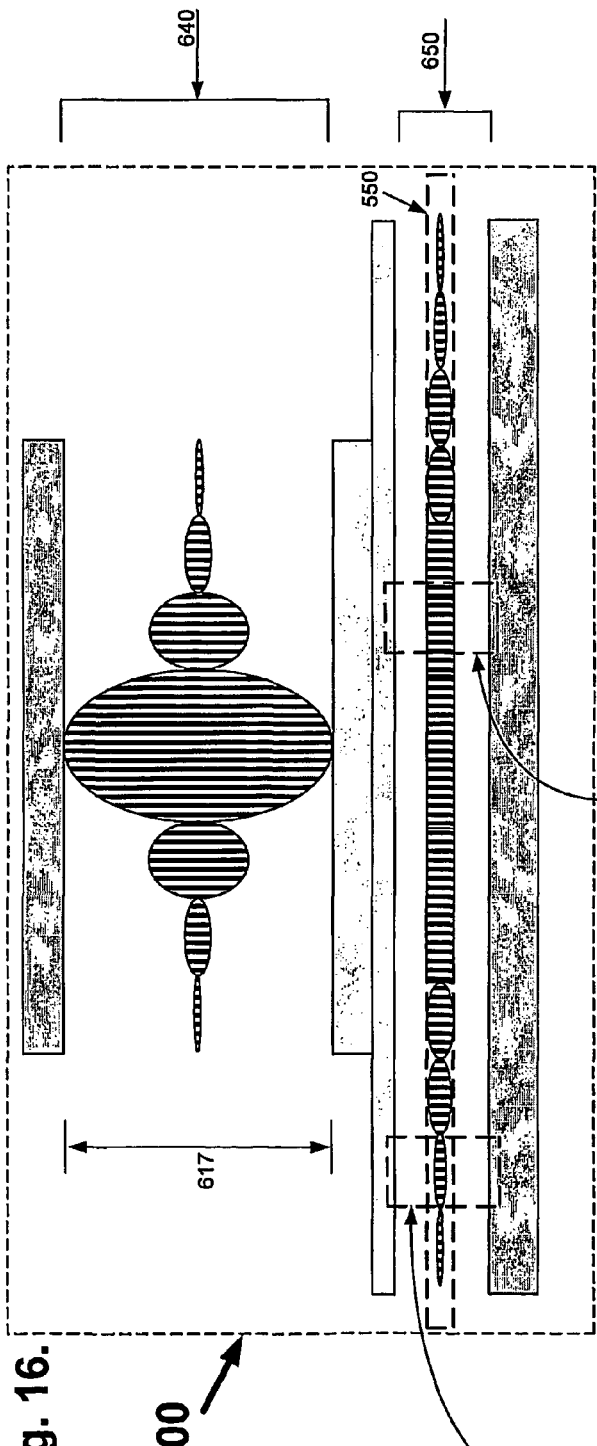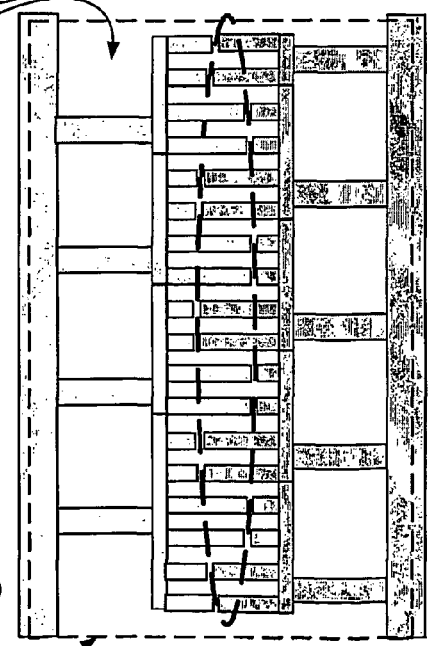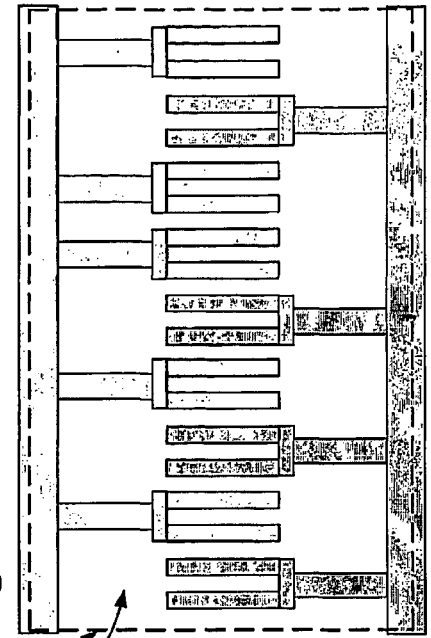

SAW WAVE-GUIDES

CROSS-REFERENCE TO RELATED APPLICATION

The present application claims the priority of U.S. Provisional Application No. 60/253,829, filed 29 Nov. 2000, the entire contents of which are incorporated herein by reference.

FIELD OF INVENTION

The invention relates generally to surface acoustic wave (SAW) devices and more particularly to SAW wave-guides, which are constructed as bordered arrays of interdigitized electrode fingers and are utilized for transmitting SAW beams.

BACKGROUND OF THE INVENTION

Generally speaking, the term "SAW wave-guide" refers to bordered strips; and the term "wave-guide effect" relates to the effect which propagation along and within a SAW wave-guide has on a SAW beam as a result of the spreading SAW waves being reflected from the strip's borders.

For the purposes of the present application, the term "SAW wave-guide" should be understood as referring to a wide class of structural arrangements using electrode fingers that impart a SAW wave-guide effect to direct SAW beam propagated thereon, as well as to other kinds of transmitting SAW beams. For example, SAW wave-guides may also include electrode finger devices which transfer SAW beams from track-to-track, or to compress or expand SAW beams, or to reverse the direction of SAW beam propagation, etc. Hereinafter, the term "zebra-wave-guide" shall be understood as referring to a SAW wave-guide that has an appearance of zebra striping, i.e. it consists of electrode fingers laid perpendicular to the SAW wave-guide's longitudinal axis.

SAW devices are often employed as filters or resonators in high frequency applications. A SAW device contains a substrate of piezoelectric material upon which a propagating surface wave is accompanied by an electric field localized at the surface, thus enabling the wave to be controlled by configuring an array of metal electrodes on the surface. Input electrical signals applied to an input transducer are converted to surface acoustic waves propagating upon the surface of the substrate, and then reconverted from acoustic energy back to an electric output signal.

In certain circumstances, a SAW beam must travel a distance on the substrate that can be several hundred or even thousands of $\lambda$ in length, where $\lambda$ is the SAW wave-length at the interested frequency. Use of anisotropic piezo-substrate usually causes diffraction spreading and deflection of the SAW beams running through such a long propagation path and consequently, this, among other reasons, leads to insertion loss (i.e. diffraction loss) and distortion of the SAW device's response.

In order to either reduce or prevent diffraction spreading, SAW wave-guides are applied. The SAW wave-guide effect, i.e. ability of the wave-guide to preserve the energy of the SAW beam, is a result of the reflection of the SAW waves from the "borders" of the wave-guide. In one known design, the borders are constructed as wide bus bars and the wave-guide looks like a grating of equidistant, usually parallel electrically-shorted electrode fingers. Alternatively, the borders may appear like walls, giving the wave-guide the appearance of a groove in the surface of the substrate with no electrode fingers within. The inverse arrangement, where the area along both edges is depressed and separated by an elevated strip, is a variation of the walls structure. In another example, a wave-guide consists of an array of isolated electrode fingers, surrounded by conductor-free surface areas which serve as wave-guide borders.

U.S. Pat. No. 5,111,168 to Panasik, discloses the use of a zebra-type SAW wave-guide and the use of using the internal relief of the zebra-wave-guide to adjust the time delay of SAW beam propagation thereon. Mechanical and electrical boundary conditions are configured in alignment with the propagating piezo-acoustic surface wave's front. This design provides additional resistance against SAW beam spreading.

Certain kinds of multi-strip couplers (MSC), which are also forms of wave guides, for example, refracted 3 dB MSC or U-type 3 dB MSC, are only accurate at one frequency point, thereby limiting the possible application of such kinds of wave-guides.

It is also known to use SAW devices as coding devices, for example tags, see for example, "SAW tags. New ideas"—IEEE Ultrasonics Symposium—1995, pp. 117–120, by Plessky V. P., Kondratiev S. N., Stierlin R. and Nyffeler F. The following technique is known for controlling phase manipulation of such devices. Several parallel tracks are provided upon which SAW beams will be propagated. Each track has an initial part that is covered by a metal strip. Some of the strips are removed, for example, by photolithography etching process or by Laser Micro-Machining Systems, thereby providing a desired delay and phase shift of the associated SAW beam. It is thought that the delay and phase shift is due to the fact that the SAW velocity within the metal covered areas differs from the SAW velocity on the free surface space. The phase shift, achieved in this way, is further affected by the thickness of the metal layer.

SAW filters have inter-digital transducers (IDT). The inter-digital transducer (IDT) is an array of parallel fingers. The fingers have opposite polarities that are suitable for launching and/or detecting SAW waves. A simple periodical uniform IDT has a $\sin(x)/x$ passband shape which is not advantageous because its transition bandwidth is equal to the filter bandwidth, and more importantly, the first frequency sidelobe is typically only 13 dB below the main response. To synthesize arbitrarily-shaped passbands, IDT topology weighting is employed. Filtering is thus accomplished in the process of generating the surface acoustic wave by the input IDT, and in the inverse process of detecting the wave by the output IDT. The most effective filtering is preferably accomplished if both input and output IDTs are weighted, and thereby participate in the filtering process. Common IDT topology weighting techniques include apodization and withdrawal weighting. Apodization is typically used for wideband filters and either apodization or withdrawal weighting typically used for narrowband filters.

Apodization means varying the length of the electrodes to achieve electrode weighting. In order to achieve high precision band pass characteristics, an apodized IDT may have more than one thousand interdigitized fingers. However, further increasing the number of interdigitized fingers does not improve characteristics, because of numerous effects which are difficult to analyze, such as diffraction spreading and propagation loss that beginning to be understood as playing a substantial role.

It is well known that it is not practical to have an input apodized transducer launching a wave directly into an output apodized transducer, because an apodized transducer launches a wave, which has a non-uniform beam profile, and, as a receiving transducer, it expects to see a uniform beam profile. If a surface wave incident upon an apodized transducer is not uniform over the entire width of the beam, the frequency response changes dramatically. For this reason, one cannot use both input apodized and output apodized transducers to form a filter unless one adds a SAW waveguide structure such as an MSC. The MSC, positioned between the apodized input and output transducers, transfers energy from a non-uniform beam into an adjacent track, in which a surface acoustic wave is launched as a uniform beam, and is thus compatible with an apodized transducer receiving the uniform beam. However, using an apodized input transducer for generating a surface acoustic wave, and transmitting the wave through an MSC to an apodized output transducer, widens the filter device, thus requiring increased space within electronic systems seeking to be ever more miniaturized.

SUMMARY OF THE INVENTION

Accordingly, it is a principal object of the present invention to overcome the limitations of existing surface acoustic wave (SAW) devices, and to provide improved methods and apparatus for SAW bandpass filters having a SAW waveguide.

It is a further object of the present invention to provide more effective wave-guide effect, i.e. keeping of the SAW beam energy within the wave-guide's track.

It is still a further object of the present invention to provide additional weighting mechanism for methods and apparatus for a SAW device having long SAW propagation path between input and output transducers.

It is yet still a further object of the present invention to provide methods and apparatus for a SAW device for reaching the fine adjustments of characteristics in wide frequency range.

It is yet another object of the present invention to provide methods and apparatus for a SAW device for reaching the high precision characteristics due to implementation of SAW inter-digital transducers (IDT) and the whole way of SAW beams propagation as a permanent combined waveguide.

It is an additional object of the present invention to provide methods and apparatus for a SAW device for reaching the high precision characteristics by means of extraction from an original apodized IDT a narrow SAW beam tracks and implementation these extracted narrow tracks as a separated weighted narrow IDT-wave-guides, connected in parallel to remained main part of IDT.

It is another object of the present invention to provide methods and apparatus for a SAW device for reaching the high precision SAW filter characteristics with reduced insertion loss in wide frequency range.

These objects, and others not specified hereinabove, are achieved by exemplary embodiments of the present invention, wherein interdigitized electrode fingers arrays are employed for use in SAW wave-guides, wherein electrode fingers are surrounded by conductor-free border spacing and yet some fingers are electrically shorted together using a minimal amount of metal conductor. Two specific features of such wave-guides are that [a] they result in a more effective wave-guide effect due to having a substantially wider border spacing of uncovered substrate (hereinafter "free surface"), in contrast to widely used wide bus bars, and [b] there is a relationship between the SAW beam front propagation time delay and the quantity of isolated electrode fingers in the wave-guide.

One aspect of the present invention, is that the desired time delay control of the SAW beam may be achieved by selecting the quantity of isolated fingers in the wave-guide. Moreover, another exemplary embodiment of the present invention uses combinations of such wave-guides having different quantities of isolated electrodes, thereby providing the desired phase shift between SAW beams on output of the associated wave-guides. This relative phase shift between the SAW beams propagating along such a combination of wave-guides is controllable due to the relationship between the SAW wave-number value and the electrical load condition, i.e. the use of either isolated or electrically shorted fingers. Thus phase shift is dependent only on a substrate's piezo-properties, and thus is independent of the density, elasticity and thickness of the electrode fingers' conductive material.

A method for SAW beam transformation comprises separating a wide SAW beam into a set of narrow SAW beams of different width by means of applying a plurality of parallel SAW wave-guides. The narrow SAW beams are phase shifted relative to one another, by utilizing parallel wave-guides having different quantities of isolated fingers. Thus there is obtained a set of SAW beams having different phases and magnitudes. This method may be used to provide good filtration of SAW waves in a SAW waves detection process. In other words, the use of the plurality of parallel SAW wave-guides allows an additional transformation of the SAW signal on its path from transducer to transducer. This degree of freedom is especially significant for long delay-lines.

In a further aspect of the present invention, combination of a 3 dB MSC and two wave-guides each having different quantities of isolated fingers allows the phase alignment of two SAW beams with one other. This alignment is true for a wide frequency spectrum.

Another exemplary embodiment of the present invention, also based on the specific properties of 3 dB MSC, comprises a unidirectional-in-wide-frequency-range (hereinafter "UWFR") SAW transducer that combines a symmetrical and/or asymmetrical bi-directional inter-digital transducer (IDT), with a U-type 3 dB MSC and two wave-guides on opposite sides of the bi-directional IDT, wherein the wave-guides are of equal length but with different quantities of isolated fingers. The difference between the number of isolated fingers which each wave-guide has must be equal to the quantity of strips of the 3 dB MSC. The resulting construction is completely unidirectional and does not reflect incident SAW waves over a wide frequency spectrum.

A further aspect of the present invention consists in the use of a double-length MSC. A double-length MSC both transforms the non-uniform front of narrow SAW beams launched by apodized IDT into a uniform front and keeps this uniformed SAW beam in the same track. The same goal is achieved by the use of another exemplary embodiment of the present invention that is constructed as a group of 3 dB MSC pairs together with a pair of wave-guides having different quantities of isolated fingers, wherein the difference of the number of isolated fingers on the wave-guides is equal to the sum of the strips of both of the 3 dB MSCs.

In a further aspect of the present invention, SAW inter-digital transducers characteristics are improved by enhancing the wave-guide effect within the IDT itself. To achieve this goal the IDT is constructed, in one exemplary embodiment, in the form of a SAW IDT-wave-guide bordered by important free surface spaces on both edges along the SAW beam propagation path. This embodiment can be expanded upon to provide an entire SAW filter useful as a single, continuous SAW wave-guide.

Another aspect of the present invention consists of constructing a combined-IDT by deriving a narrow track from a previously existing apodized IDT topology and using the derived narrow track as a separate narrow SAW IDT-wave-guide. The combined-IDT represents a combination of the remainder of the cannibalized apodized IDT topology as the main-IDT and connecting thereto the narrow SAW IDT-wave-guides in parallel.

An additional aspect of the present invention is the use of a partially-unidirectional-combined-IDT that has a separated "main" track formed by a UWFR SAW transducer and a narrow track formed by a narrow SAW IDT-wave-guide which remains bi-directional. This significantly reduces any worry about the small remianing amount of insertion loss caused by bi-directionality of launching and/or detecting by the narrow IDT-wave-guide.

By assembling the above-described embodiments of the present invention into various combinations and permutations, one can improve SAW filters characteristics in the following ways:

Canceling an unwanted distortion of the frequency responses shape due to canceling the diffraction spreading of the SAW beams by means of constructing of the entire SAW filter as a permanent SAW wave-guide;

Reducing an insertion loss due to the use of unidirectional transducers having U-type 3 dB MSC in combination with pair of wave-guides having different quantity of isolated fingers, that provides the desire effect in wide frequency spectrum;

Providing a possibility of complete tuning of the SAW device with external circuit load, thereby a decreasing insertion loss with no distortion of the frequency response shape due to the feature that the parasitic triple-transit signals are canceled by applying of the unidirectional transducers having U-type 3 dB MSC in combination with pair of wave-guides with different quantity of isolated fingers;

Providing an additional degree of freedom to build more sophisticated weighting pulse-function by use apodized topology for both input and output IDTs arranged in-line along one track, wherein non-uniform SAW beam front in output IDT is transformed to uniform front by means of applying wave-guides containing MSC;

Reducing an expenditure of a SAW device fabrication by means of decreasing a piezo-crystal surface area that achieved by miniaturization of the SAW device topology utilizing in-line arranged two apodized IDT that is provided by use of a U-type 3-dB MSC in combination with pair of wave-guides with different quantity of isolated fingers; the easy calculation of the both apodized IDT topologies becomes possible due to an effect that when launched SAW beam, having non-uniform SAW wave front, propagates through two U-type 3-dB MSC, it transforms to a SAW beam with a uniform SAW wave front;

Reducing an expenditure of a SAW device fabrication by means of decreasing a piezo-crystal surface area that achieved by miniaturization of the SAW device topology due to enforced wave-guide effect utilization for obtaining small aperture IDT-wave-guides, where SAW beams propagate substantially with no diffraction spreading; and moreover, the utilization of IDT-wave-guides of small aperture causes a decreased unwanted signal leakage effect that allows an additional miniaturization of SAW device by reduction of distance between the IDT-wave-guides, thereby, it allows an additional miniaturization of SAW device by convergence of launching and detecting combined-IDT as well;

Improving high precision characteristics of apodized interdigital transducers by means of more exact implementation of small weights train, that is achieved by:
(a) Extracting a narrow track from the original apodized IDT topology by such a way that a lot of small overlaps are aggregated in the narrow track, so the main-IDT topology remains without the extracted narrow track;
(b) Implementing the extracted narrow track as a separated apodized narrow SAW IDT-wave-guide;
(c) Connecting the obtained separated apodized narrow SAW IDT-wave-guide in parallel to the main-IDT constituting a "combined-IDT" topology, whereby the apodized narrow SAW IDT-wave-guide, comprising a lot of small overlaps, and the main-IDT are separated and play role of parallel parts of the combined-IDT topology; and Providing improved high precision characteristics of a miniaturized SAW filter topology by an utilization of two in-line arranged partially-unidirectional-combined-ITD, wherein each partially-unidirectional-combined-ITD topology represents a construction, where the combined-IDT's main-IDT, rounded up with a U-type 3-dB MSC in combination with pair of wave-guides with different quantity of isolated fingers, becomes unidirectional, and the combined-IDT's weighted narrow IDT-wave-guide remains bi-directional.

BRIEF DESCRIPTION OF DRAWINGS

The above-mentioned objectives and others not mentioned hereinabove, are achieved by the present invention, a detailed description of which follows herewith and which may be better understood by reference to the appended drawings which are briefly described as follows:

FIG. 15 shows a prior art SAW inter-digital transducer topology having a symmetrical apodization;

FIG. 15a illustrates how an imaginary apodization line defines an interdigitized fingers overlapping;

FIG. 16 shows an exemplary embodiment of the present invention, comprising a combined two-track SAW inter-digital transducer topology having apodization in each track, wherein the narrow track represents a narrow IDT-wave-guide;

FIGS. 16a and 16b show an exemplary embodiment of the present invention, comprising a technique of an apodized narrow IDT-wave-guide implementation;

DETAILED DESCRIPTION OF PREFERRED EMBODIMENTS

1. Free Surface Space Borders as an Attribute of SAW Wave-Guide.

Figure 1:
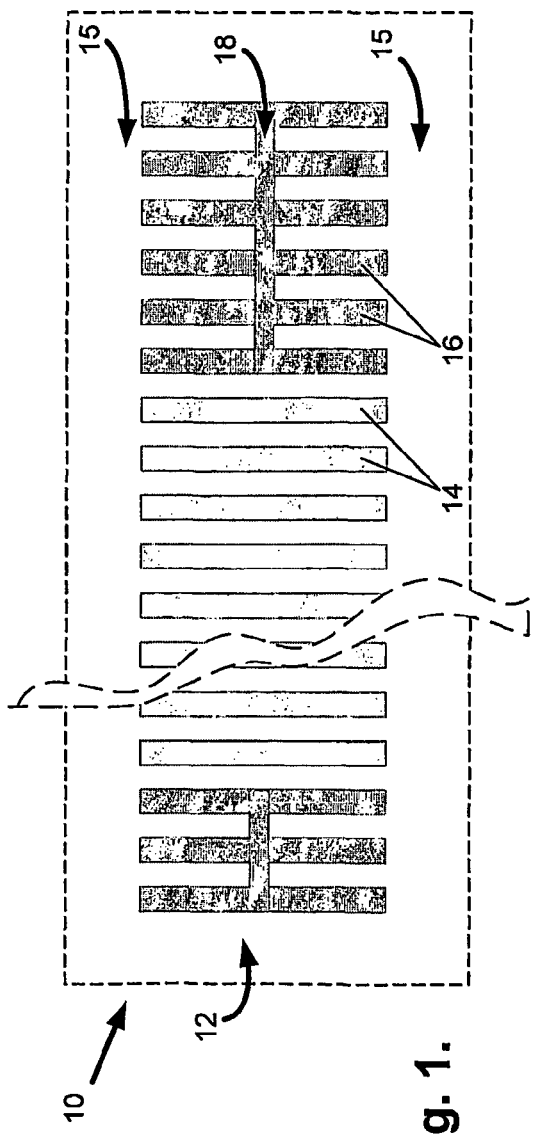
FIG. 1 illustrates an exemplary embodiment of the present invention in which a free surface space bordered SAW wave-guide has isolated fingers and fingers which are electrically shorted by internal inter-finger connectors.

Referring now to FIG. 1, an exemplary embodiment of the present invention comprises a zebra-type SAW wave-guide 10 having an electrode fingers array 12 bordered by substantially wide free surface spaces 15. A wave-guide effect border is achieved when a free surface space border along a wave-guide edge has a sufficient width to achieve the desired reflection of the SAW beam. Such an effect is usually quite apparent when the width is on the order of several $\lambda$, where $\lambda$ is the wave-length of the SAW beam at the desired frequency, e.g. from $2\lambda$–$10\lambda$, although the effect decreases until it is insignificant below $\frac{1}{2}\lambda$ with currently used substrate and electrode materials. The zebra-type SAW wave guide 10 has two different general categories of electrodes, electrode fingers 14 which are electrically isolated and electrode fingers 16 which are electrically shorted by inside connectors 18. In order that the inside connector presence do not significantly disturb a SAW beam's front, the width of the connectors should be substantially less than $\lambda$.

A zebra-type SAW wave-guide 10 thus constructed has the following two attributes:

it has both: substantially wide free surface spaces 15 constituting borders substantially surrounding the electrode fingers 14 and 16, separating them from the edge of the wave-guide; and necessarily unobtrusive inside connectors 18 providing an electrical short between electrode fingers 16.

Figures 2A, 2B:
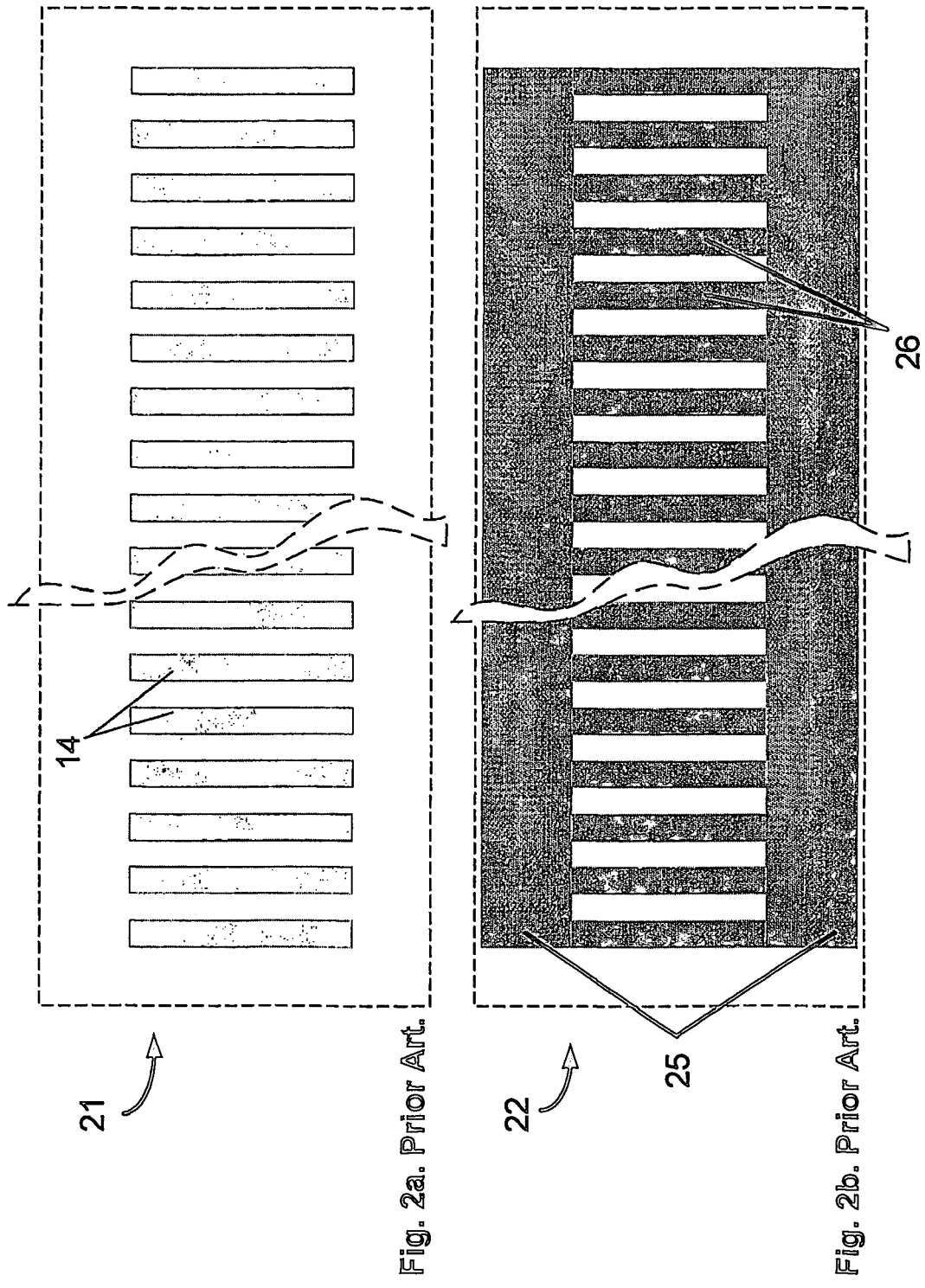
FIG. 2a shows a prior art SAW wave guide having only isolated fingers.
FIG. 2b shows a prior art SAW wave guide having electrically shorted fingers and important wide bus bars.

Calculations show that the wave-guide effect is enhanced if the array of fingers 14 and 16 is bordered by the free surface spaces 15, in contrast to the case, when the array of fingers 26 is bordered by wide bus bars 25, as it is illustrated in prior art FIG. 2b.

It should be noted that while zebra-type SAW wave-guide 10 is shown having some electrode fingers 16 which are shorted and other electrode fingers 14 which are not shorted, i.e. isolated, it is not necessary that there be any isolated electrode fingers 14, however, their addition can produce desirable effects.

2. Time Delay Control.

As mentioned hereinabove, the quantity of isolated electrode fingers 14 in Zebra type SAW wave-guide 10 provides a degree of freedom for controlling the time delay of the SAW beam propagation. The SAW beam propagation delay in prior art zebra-wave-guide 21, having only isolated electrode fingers 14 (FIG. 2a), is defined only by length of the zebra-wave-guide 21. The SAW beam propagation delay in prior art zebra-wave-guide 22, having only electrically shorted electrode fingers 26 (FIG. 2b), is also defined only by the length of the zebra-wave-guide 22. The present invention provides methods for the time and phase control of a SAW beam front, that are based on the realtionship between SAW wave-number and electrical load conditions: either isolated or electrically shorted fingers. In general, the inventive methods comprise providing structures which have varying quantities of isolated electrode fingers, arranged in various combinations and permutations with shorted electric fingers, on a zebra-wave-guide structure.

3. Reflecting Wave-Guide.

If the periodicity of the array 12 (FIG. 1) is equal to $N\lambda/2$, where N is an integer value, the zebra type SAW wave-guide 10 becomes a reflector, because partial SAW waves, reflected on the electrode fingers 14 and 16, are summed in-phase, thereby forming a reflected SAW beam propagating in the reverse direction.

Figure 1A:
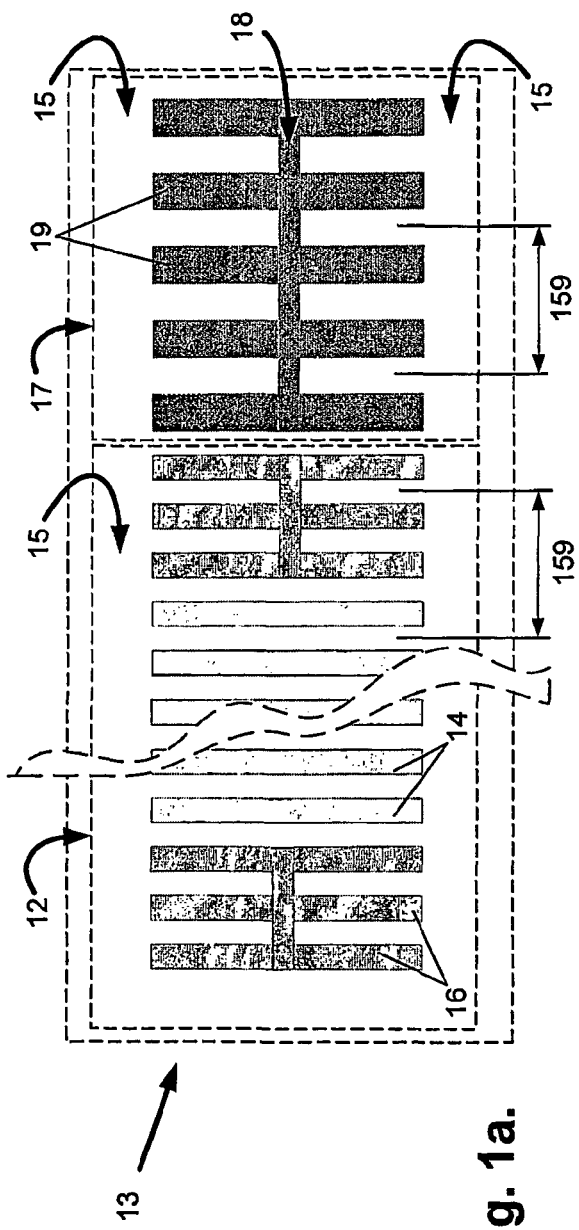
FIG. 1a illustrates an exemplary embodiment of the present invention comprising a free surface space bordered complicated permanent SAW wave-guide having a fragment for delay controlled transmitting the SAW waves and a fragment for reflecting the SAW waves.

FIG. 1a shows an exemplary embodiment of the present invention in which a complicated permanent wave-guide 13 having free surface borders 15 and internal inter-finger connections 18 and consisting of two functional parts: SAW transmitting part 12 and SAW reflecting part 17. The SAW transmitting part 12 has fingers 14 and 16, which are arranged with a periodicity of three fingers per $\lambda$ 159 in one section, thereby providing full cancelling of partial SAW waves reflected from every three fingers. The quantity of isolated fingers 14 defines the time delay as well as the phase shift of the propagating SAW beam front. The SAW reflecting part 17, has fingers 19, which are arranged with a periodicity of two fingers 19 per $\lambda$ 159, thereby providing in-phase summing of reflected partial SAW waves.

4. Phase Manipulation.

Figure 3:
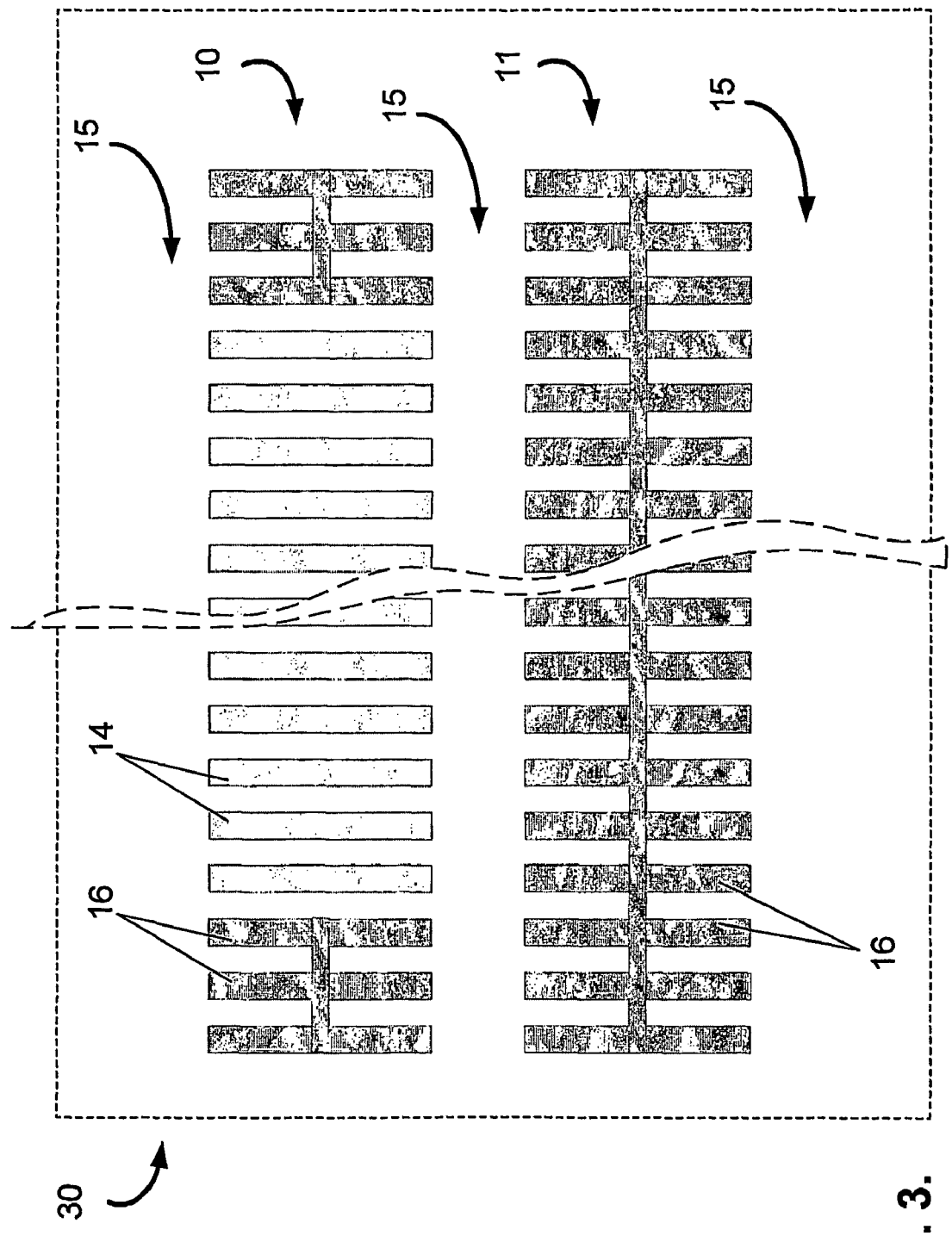
FIG. 3 shows an exemplary embodiment of the present invention, comprising a combination of two SAW wave-guides having different quantity of isolated fingers.

FIG. 3 shows an exemplary embodiment of the present invention in which an aggregated wave-guide 30 comprises a combination of two zebra-type SAW wave-guides 10 and 11. The zebra-wave-guides 10 and 11 have different quantities of isolated fingers 14. A method for controlling relative phase shift of partial SAW beams' fronts consists of utilizating the method for SAW beam front time delay and phase control, applied to each separate track associated with that corresponding zebra-wave-guide. The SAW beam propagates with different wave-numbers Ksc and Koc within intervals having arrays of fingers 16 and fingers 14, respectively. This fact causes relative shift of time delays between the SAW beams propagating along the zebra-wave-guides 10 and 11 respectively. Thus the SAW beam phase manipulation may be achieved by the positioning of the aggregated wave-guide 30 into the path of the SAW beam. It is important to note that if the fingers arrays of the zebra-wave-guides 10 and 11 are of the same periodicity, the difference between Ksc and Koc is defined independently of the density, elasticity and thickness of the electrode fingers' conductive material. This difference (Ksc–Koc) depends only on the substrate's piezo-properties. Thereby the relative shift of time delays between the SAW beams propagating along the zebra-wave-guides 10 and 11 may be controlled by the difference in quantity of isolated fingers 14 independently of the selected kind and thickness of conductive material of the electrode fingers 14 and 16.

Figure 4:
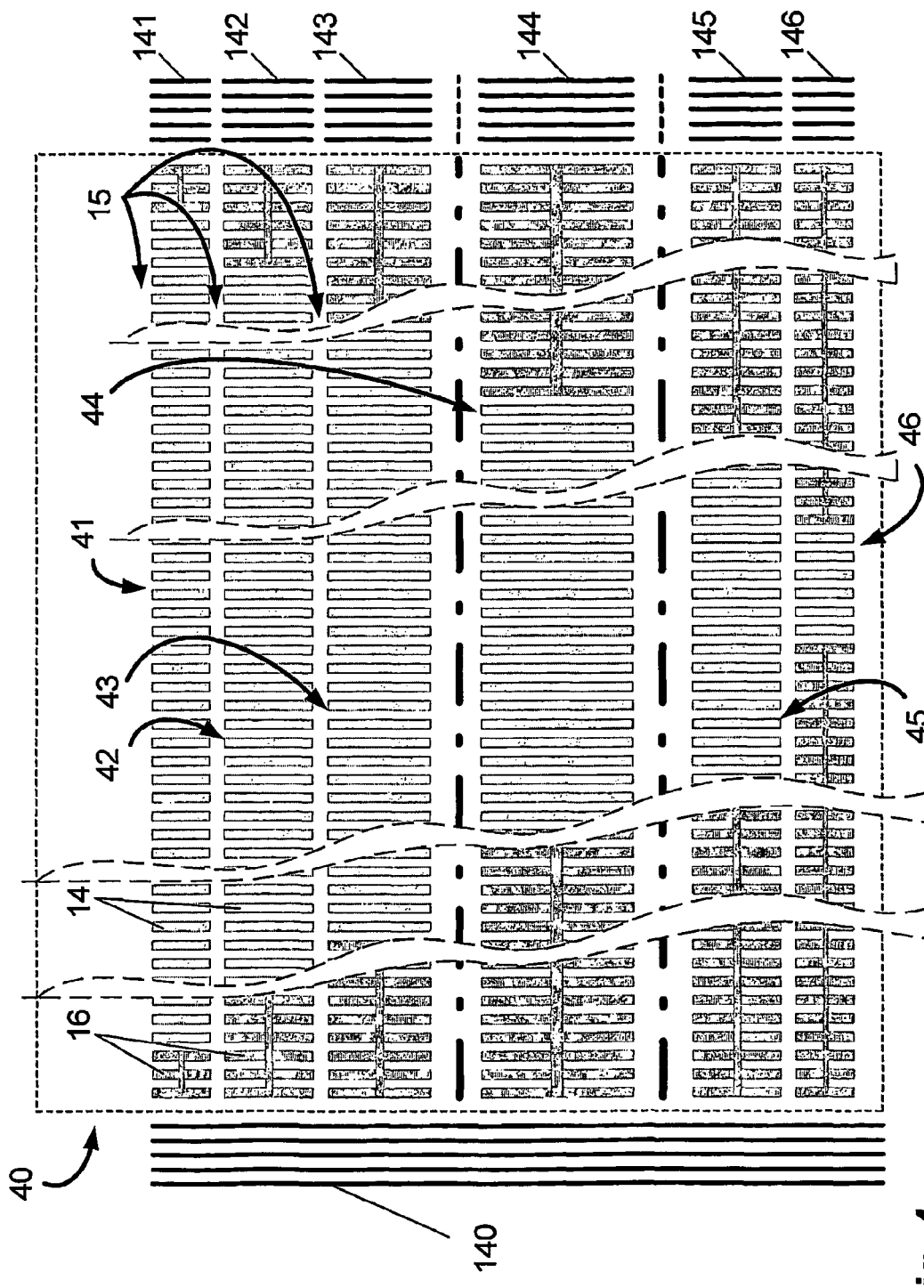
FIG. 4 shows an exemplary embodiment of the present invention, comprising a plurality of SAW wave-guides weighted by width and having different quantity of isolated fingers.

FIG. 4 shows an exemplary embodiment of the present invention in which an aggregated wave-guide 40 comprises a combination of plurality of parallel zebra type SAW wave-guides 41–46 having different widths and quantities of isolated fingers 14. A method for SAW beam front transformation consists of dividing a wide SAW beam 140 into a set of separate narrow SAW beams 141–146 weighted by width and time-delay using a plurality of parallel Zebra type SAW wave-guides. Relative phase shifts of SAW beams' fronts 141–146 may come to more than ($100\pi$) for long delay-lines made on piezo-substrate with high coupling coefficient, where $\pi$ is the constant equal to 3.1415926 . . . . Moreover, each SAW beam is weighted by the width of the associated wave-guide. Thereby good filtration of SAW waves may be achieved in SAW waves detection process. In other words, the aggregated wave-guide 40, consisting of a combination of a plurality of zebra type SAW wave-guides, allows an additional transforming of the SAW signal on its path from transducer-to-transducer. This attribute becomes significant for long delay-lines. The relative phase shifts are controlled by the direct relationship of the SAW wave number value on electrical boundary conditions, i.e. one kind of fingers array: array of either isolated or electrically shorted fingers. Thus, the relative phase shifts are defined independently of the density, elasticity and thickness of the electrode fingers' conductive material as well as for combination 30 of two Zebra type SAW wave-guides 10 and 11. Thus the phase control of SAW beam by either combination 30 or combination 40 is effective, if a SAW device is based on a piezo-substrate with high coupling coefficient.

5. Transmission, Transformation, Compression and Expansion of the SAW Beam.

Figure 5A:
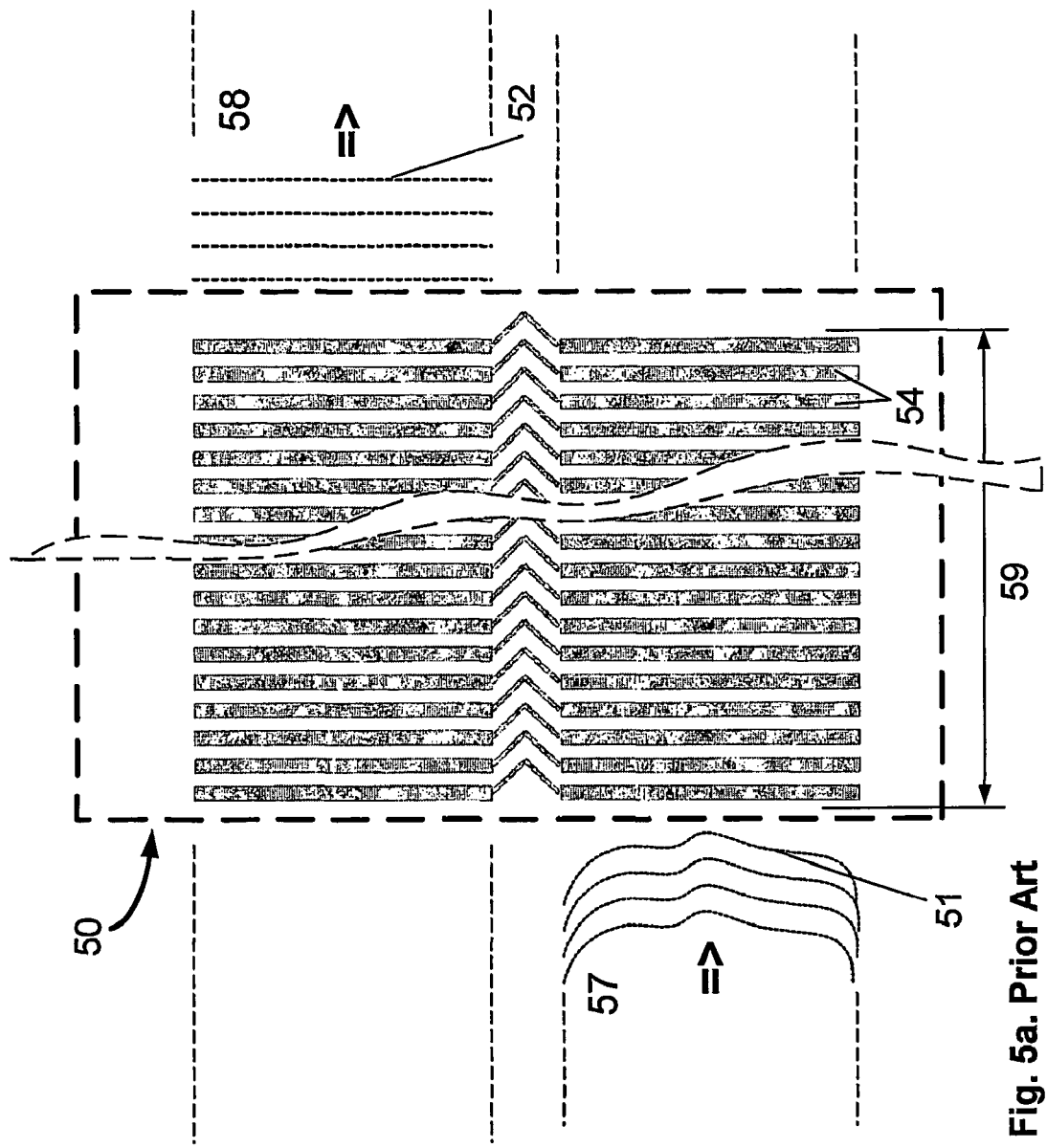
FIG. 5a shows a prior art multi-strip coupler (MSC)

A prior art MSC 50, that is shown in FIG. 5a, transfers the SAW beam, having non-uniform front 51, from track 57 to track 58 completely, forming the SAW beam with uniform front 52. The MSC's 50 length 59 is equal to PI/(Ksc–Koc), where Ksc is the wave-number of the SAW wave propagation within array of electrically shorted fingers 26 of the prior art zebra-wave-guide 22 and Koc is the wave-number of the SAW wave propagation within array of isolated fingers 14 of the prior art zebra-wave-guide 21.

Figure 17:
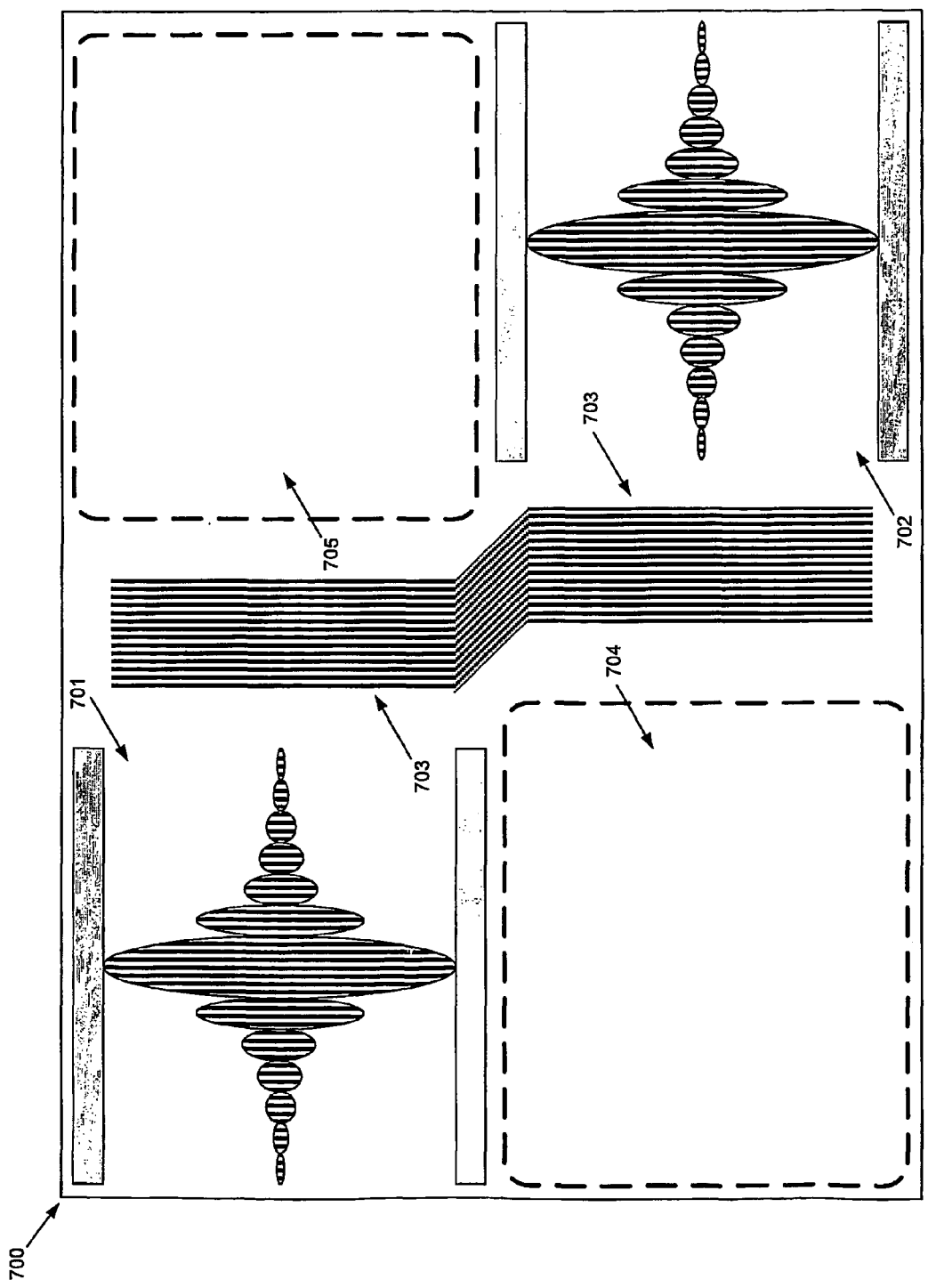
FIG. 17 schematically illustrates prior art SAW filter topology, having two apodized IDT.

The main goal of prior art MSC 50 is to transform non-uniform SAW beam's front to a uniform one. This feature is widely applied when a designer uses apodized topology for both input and output IDTs. However, in this case, the size of the SAW filter is dramatically enlarged, as it is schematically illustrated in FIG. 17, where areas 704 and 705 are not in use, thus increasing the cost of device.

Figure 6A:
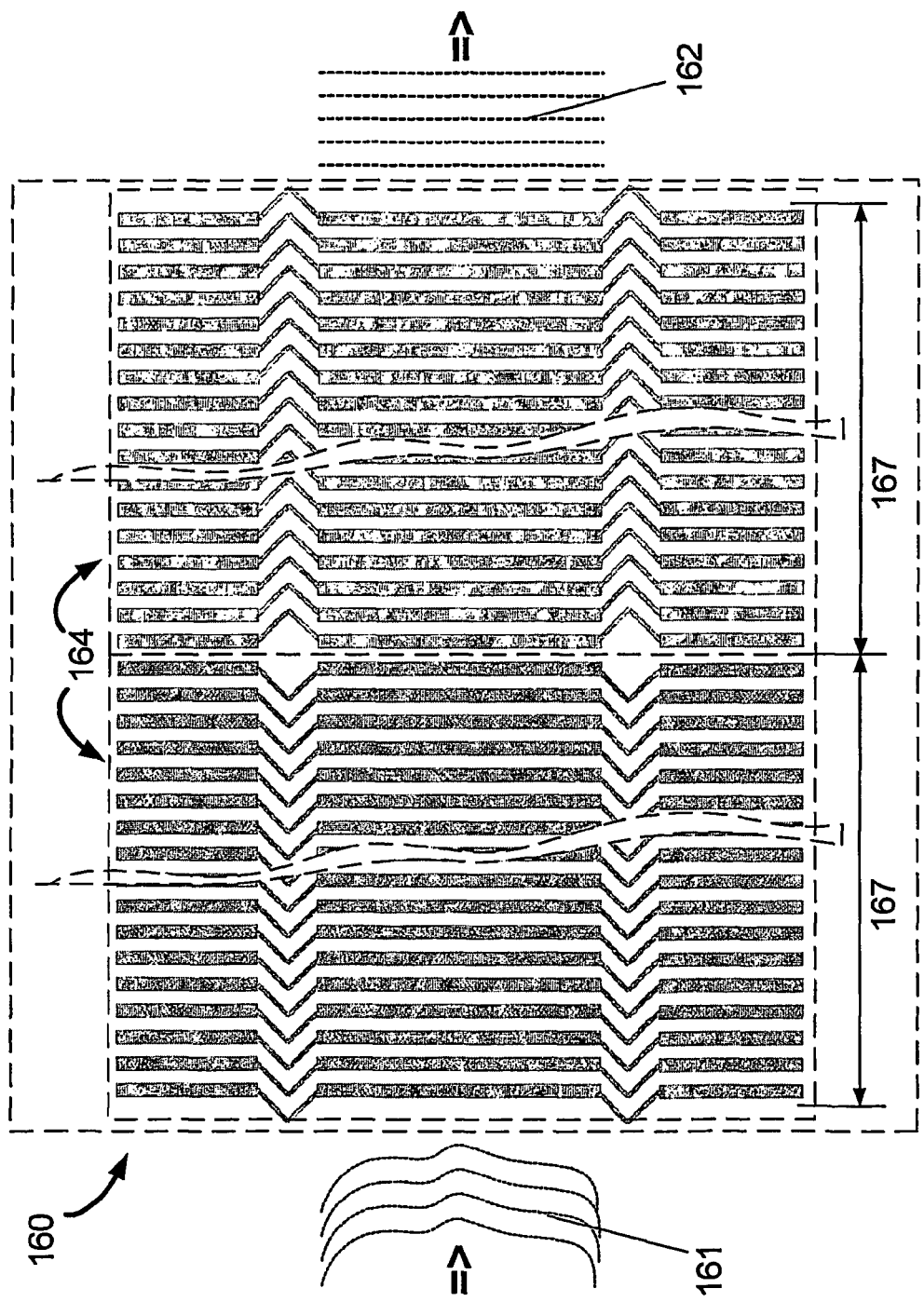
FIG. 6a shows an exemplary embodiment of the present invention, comprising a SAW MSC-wave-guide represented as double-length MSC for providing a uniform SAW beam front and still maintaining the front in its original track.

FIG. 6a shows, as an exemplary embodiment of the present invention, a SAW MSC-wave-guide 160, that is used to transformer a non-uniform SAW beam's front 161 to a uniform front 162, wherein the SAW beam propagation is maintained in the same track. The SAW MSC-wave-guide 160 represents MSC of twice length 167, where length 167 is the same as 59 and sub-construction 164, in principal, is the same as prior art MSC 50. The SAW MSC-wave-guide 160 provides both: transforming SAW beam of non-uniform front to uniform one and keeping the SAW beam in the same track, by means of MSC-effect of the SAW beam transmitting from track-to-track and back again.

Figure 5B:
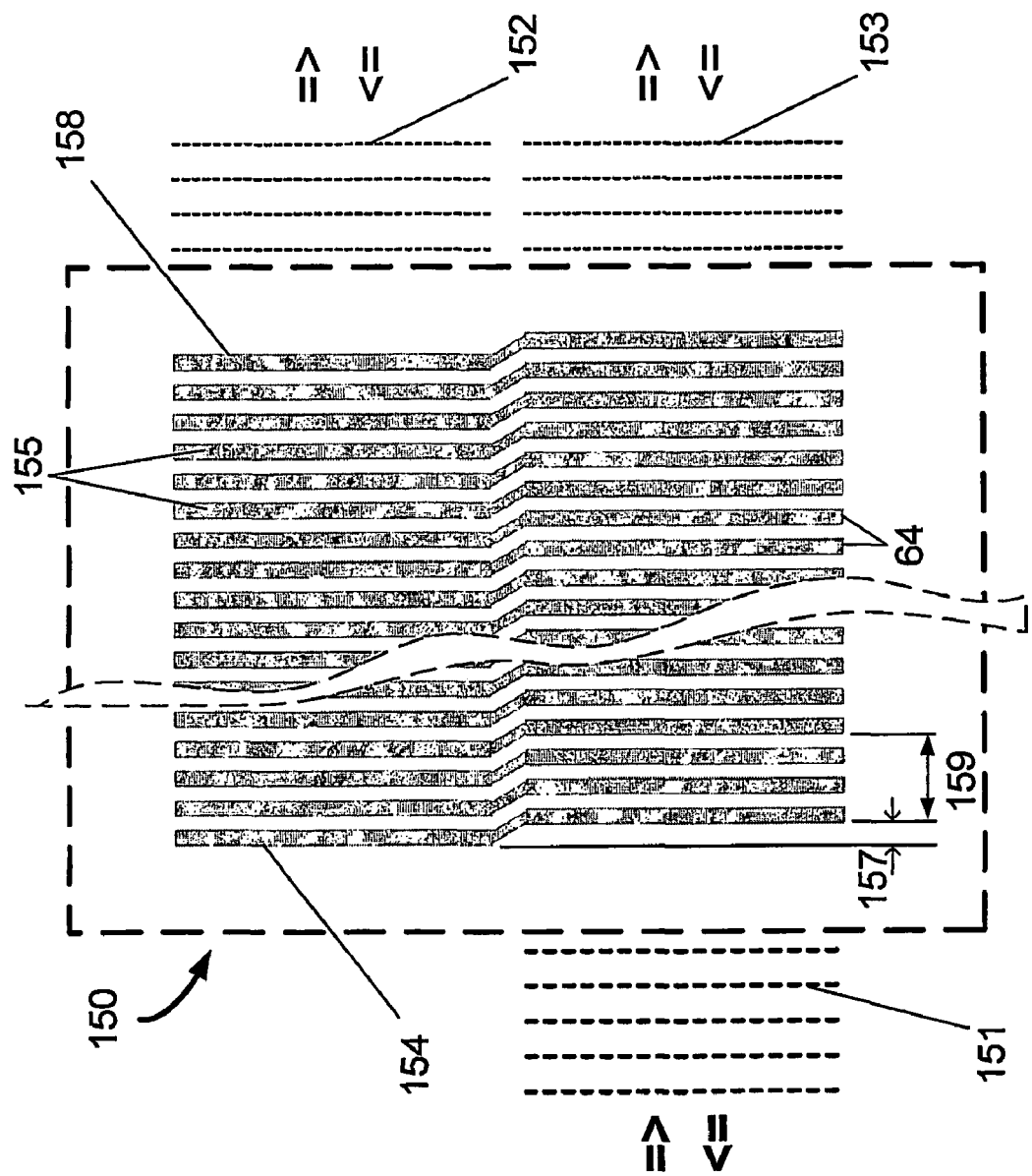
FIG. 5b shows a prior art SAW beam compressor/expander based on refracted 3 dB MSC.

A prior art SAW beam compression/expansion is achieved by utilization of 3 dB multi-strip coupler (3 dB-MSC) 150, as it is shown in FIG. 5b. The quantity of strips in prior art 3 dB MSC 150 is equal to half of quantity of strips of prior art MSC 50. The SAW beam 151 on the left strip 154 of 3 dB-MSC 150 is divided between two beams 152 and 153, wherein these two beams 152 and 153 are of equal magnitude and are in phase quadrature on the right strip 158. In order to align phases of the SAW beams 152 and 153 with each other, the refraction of ($\lambda/4$) for each of the 3 dB-MSC's strips 154,155 and 158 is used. The value $\lambda$ directly depends on frequency, so the phases of the SAW beams' fronts 152 and 153 may be exactly aligned with each other only at the specific frequency and the phase-alignment is distorted for other frequencies in this prior art technique.

Figure 6B:
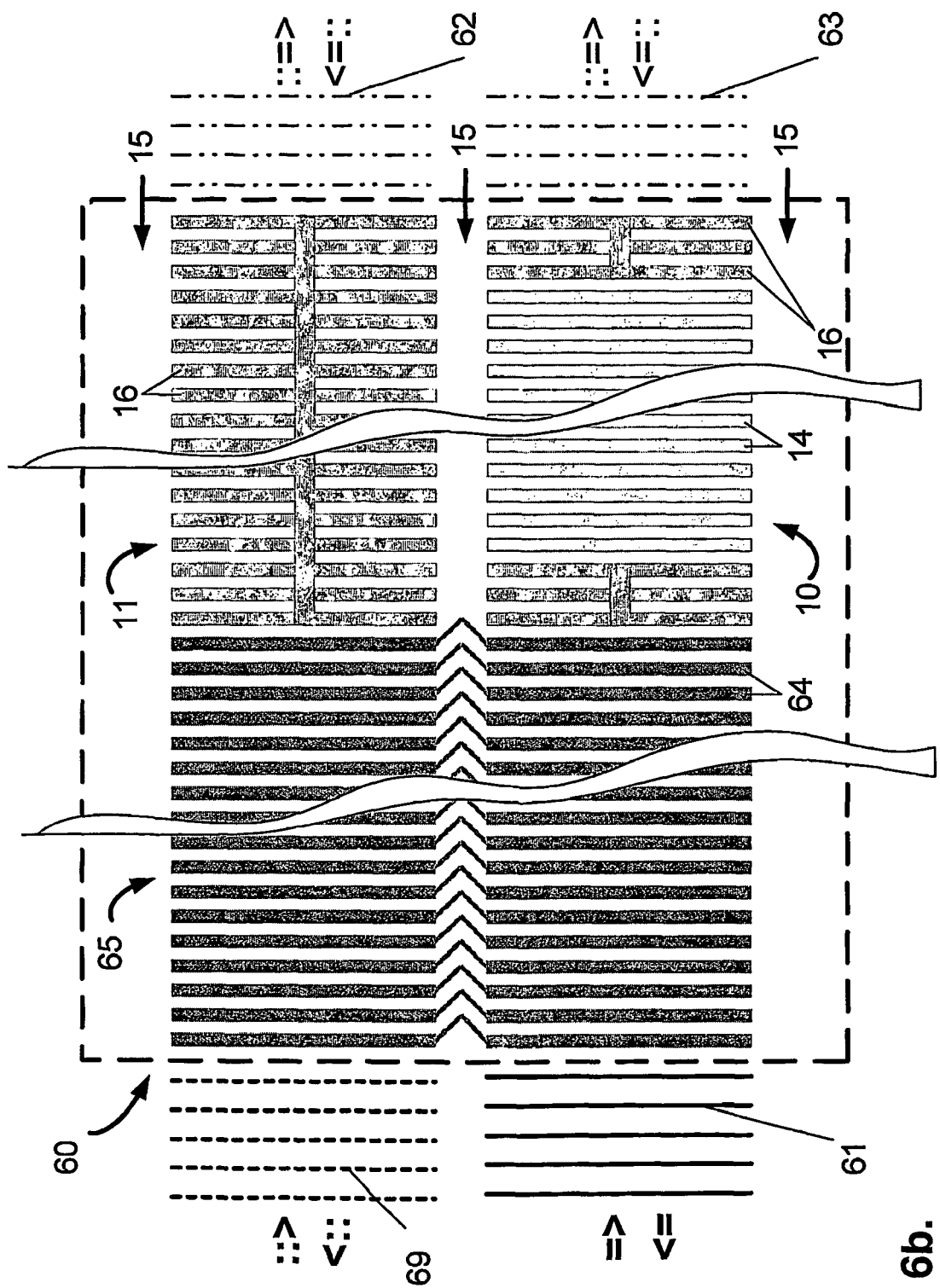
FIG. 6b shows an exemplary embodiment of the present invention, comprising a SAW beam compressor/expander based on utilization of combination of 3 dB MSC and two SAW wave-guides having different quantity of isolated fingers.

This distortion derived in the prior art device shown in FIG. 5b may be avoided by the utilization of the construction, shown in FIG. 6b which shows an exemplary embodiment of the present invention comprising a SAW beam compressor/expander based on utilization of a combination 60 of non-refracted 3 dB-MSC 65 and two Zebra type SAW wave-guides 10 and 11 bordered by free surface spaces 15 and having different quantity of isolated fingers 14, arranged with the same periodicity as the 3 dB-MSC's fingers, wherein the periodicity is adapted for compensation of the SAW wave reflections from fingers. The zebra-wave-guides 10 and 11 of the construction 60, having the same aperture, are of the same length, wherein a fragment of the zebra-wave-guide 10, having only isolated fingers 14, has length $L=0.5 \pi/(K_{sc}-K_{oc})$ and wherein the difference of the isolated fingers 14 quantity is equal to the number of strips of the 3 dB-MSC. Such a construction 60, operating as an expander, splits a SAW beam having front 61 into two equivalent beams with fronts 62 and 63. This effect is achieved by the following: a SAW beam, having front 61, enters into 3 dB-MSC 65 where the SAW beam undergoes a 3 dB split into two tracks $T_{oc}$ and $T_{sc}$ associated with the zebra-wave-guides 10 and 11, respectively. SAW beams $B_{oc}$ and $B_{sc}$ in associated tracks $T_{oc}$ and $T_{sc}$ respectively are of the same amplitude and in phase-quadrature on output from 3 dB-MSC 65. Furthermore, the SAW beams $B_{oc}$ and $B_{sc}$ enter into two parallel zebra-wave-guides 10 and 11 respectively, where they propagate with different wave-numbers (the wave-number $K_{oc}$ corresponds to fragment of zebra-wave-guide 10, having isolated fingers and the wave-number $K_{sc}$ corresponds to fragments of zebra-wave-guides, having electrically shorted fingers). As a result, the two SAW beams $B_{oc}$ and $B_{sc}$ become in-phase on output from zebra-wave-guides 10 and 11. The phase alignment of the SAW beams' fronts 62 and 63, achieved by this technique, is the same for wide frequency spectrum in contrast to prior art refracted 3 dB MSC 150 utilization, where exact alignment is possible only for a specific frequency point. Conversely, by reciprocity, such a construction 60 compresses a wide beam having uniform front 62 plus 63 to a beam having front 61.

The upper and lower paths of this construction 60 are not identical. And the SAW beam having front 69 in the upper path is split into two beams with fronts 62 and 63 which differ in phase by 180°. This phase shift is possible over a wide frequency spectrum in contrast to prior art refracted 3 dB-MSC 150 utilization, where the desired phase shift is achievable only for the specific frequency point.

Figure 6C:
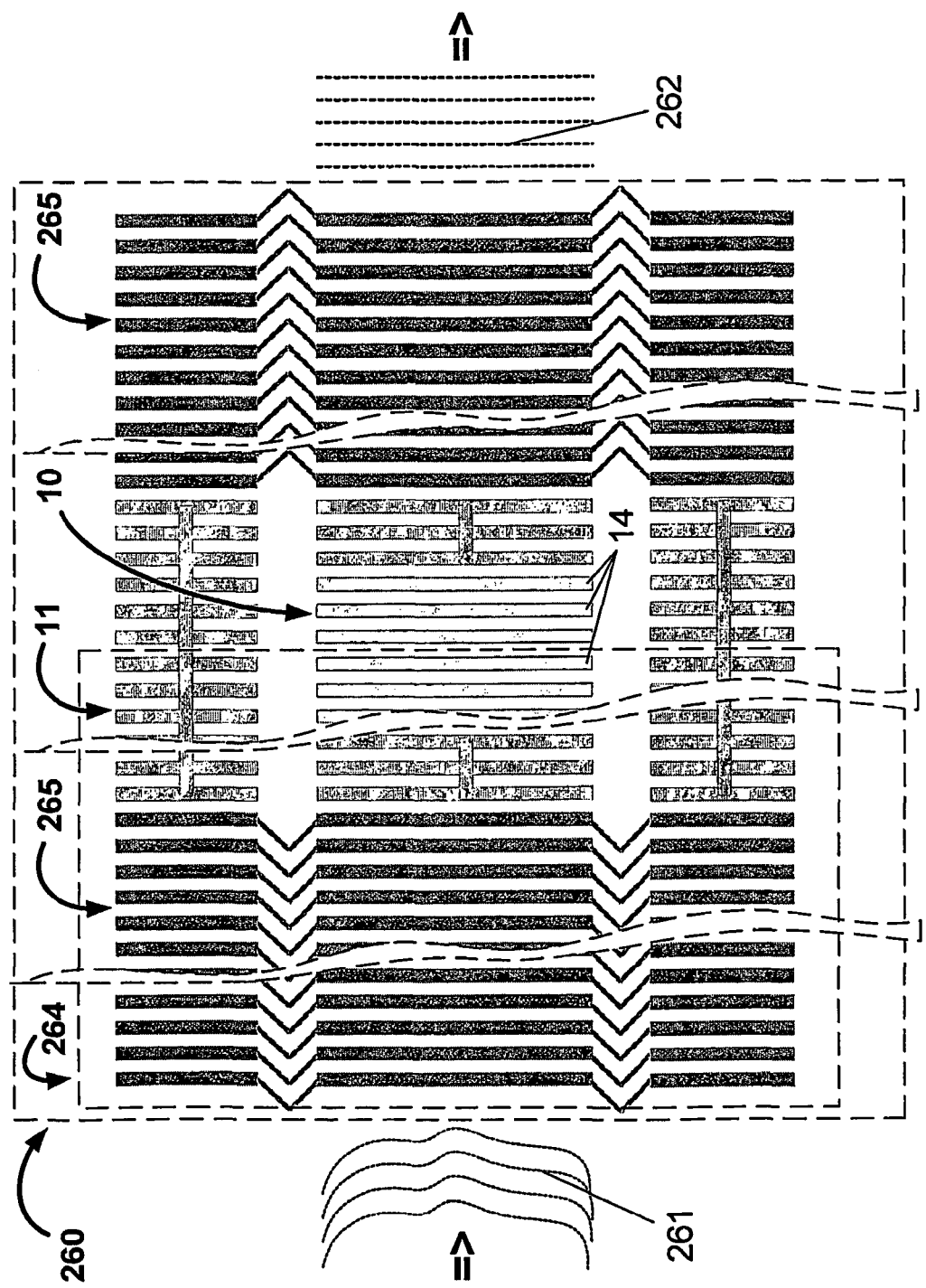
FIG. 6c shows an exemplary embodiment of the present invention, comprising a SAW beam front transformer represented as combination of pair of 3 dB MSCs and two kinds of wave-guides differ by quantity of isolated fingers.

FIG. 6c shows, as an exemplary embodiment of the present invention, a SAW beam front transformer 260 of non-uniform SAW beam's front 261 to uniform one 262, wherein the SAW beam propagation is kept into the same track. The SAW beam front transformer 260 represents a combination of pairs of non-refracted 3 dB MSC 265 and zebra-wave-guides 10 and 11 having different quantity of isolated fingers 14, wherein this difference of the isolated fingers 14 quantity is equal to the number of strips in both 3 dB MSC 265. The 3 dB MSC 265, in principle, is the same as 3 dB MSC 65. Thereby the SAW beam transformer 260 represents an expander-compressor pair, i.e. a pair of mirrored combinations 264. The combination 264, in principle, is the same as the SAW compressor/expander 60.

6. Transformation of Bi-directional SAW Beam to Unidirectional SAW Beam.

Figure 7:
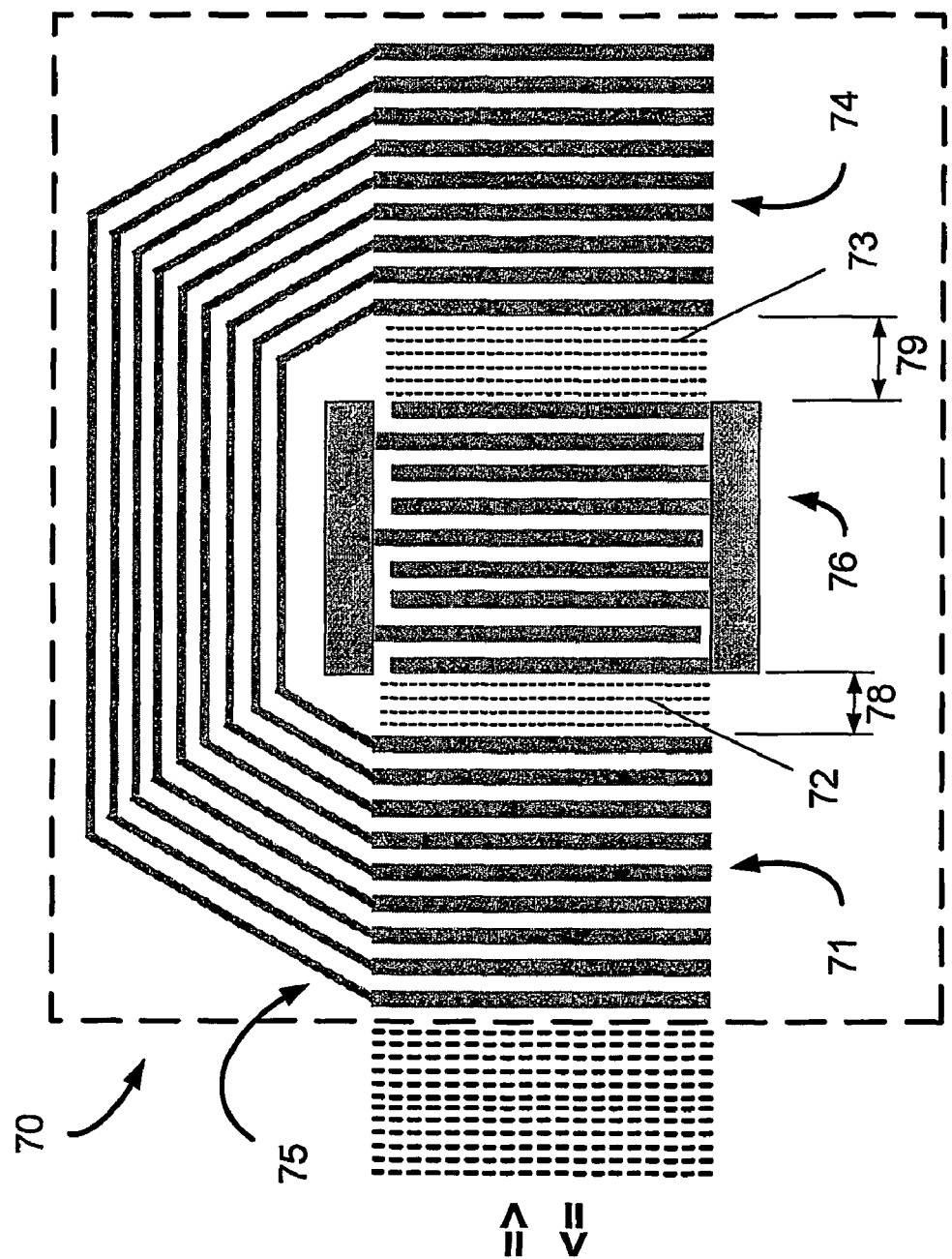
FIG. 7 shows a prior art construction containing the U-type 3 dB-MSC for transformation of bi-directional SAW beam to unidirectional SAW beam.

FIG. 7 shows prior art construction 70 containing the U-type 3 dB-MSC 75 for transformation of bi-directional SAW beam to unidirectional SAW beam. As described by D. P. Morgan in the book titled "Surface-Wave Devices for Signal Processing"-Elsevier-1985, a symmetrical unapodized bi-directional inter-digital transducer (IDT) 76 is located between the parallel arms 71 and 74 of the U-type 3 dB-MSC 75. Wherein the IDT 76 is positioned to the left of the U-type 3 dB-MSC's 75 center thus the distance 78 from the IDT 76 to the left arm 71 of the U-type 3 dB-MSC's 75 is less than the distance 79 from the IDT 76 to the right arm 74 of the U-type 3 dB-MSC's 75, and the difference between the distances is equal to $\lambda/4$. In this case the waves 72 and 73 propagate from the U-type 3 dB-MSC's 75 arms 71 and 74 in phase quadrature. The SAW wave leaving the coupler from his right side is the sum of two components, arising from the waves launched to left and right by the transducer. The sum of the two components is equal to zero at the right side when the MSC, providing 3 dB phase quadrature coupling, is positioned giving an additional phase quadrature shift. Thus, SAW waves emerge only from the left side of the MSC. By reciprocity, a wave incident from the left will not be reflected provided the IDT 76 is matched, and this feature is useful for minimizing the triple-transit spurious signal in surface wave devices. However, behavior is strictly unidirectional only at one particular frequency and the phase-alignment is distorted for other frequencies in this prior art technique.

Figure 8:
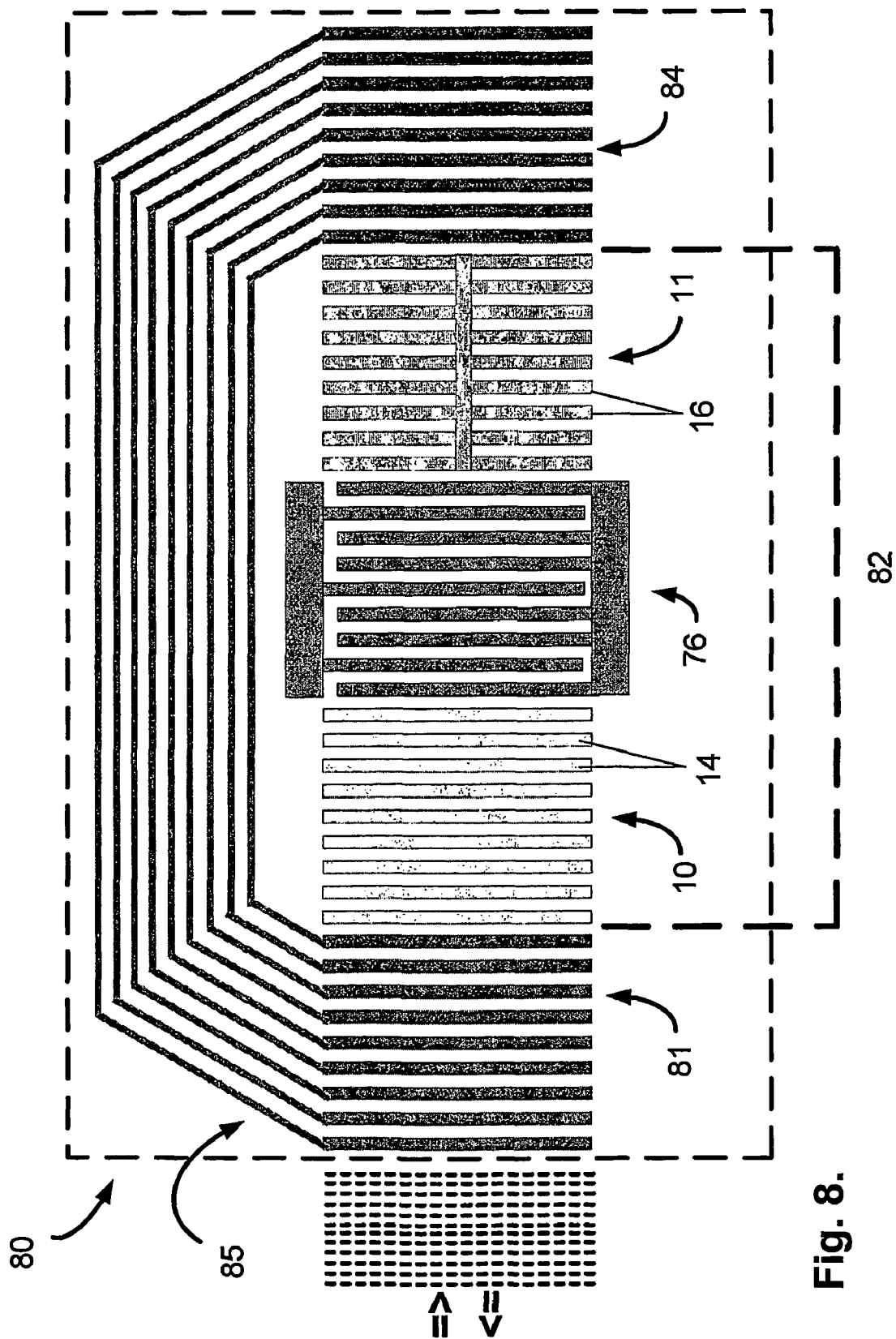
FIG. 8 shows an exemplary embodiment of the present invention, comprising a construction containing the combination of U-type 3 dB-MSC and two SAW wave-guides having different quantity of isolated fingers for transformation of a symmetrical bi-directional SAW IDT to unidirectional SAW IDT.

The construction 80, shown in FIG. 8, is an exemplary embodiment of the present invention, comprises the combination of the zebra SAW wave-guides 10 and 11, which have different quantity of isolated electrodes, and the IDT 76 which centered between the U-type 3 dB-MSC's 85 arms 81 and 84. The left Zebra type SAW wave-guide 10 contains more quantity of isolated fingers 14. A phase-anisotropic IDT 82, as an exemplary embodiment of the present invention, comprising by a sub-construction 82, consists of bi-directional IDT 76 and pair opposing zebra-wave-guides 10 and 11 having different quantity of isolated fingers. If the difference of the isolated fingers 14 quantity is equal to quantity of the U-type 3 dB-MSC's 85 strips, an additional relative phase shift between SAW beams propagating on opposite sides of the bi-directional IDT 76 is equal to 90 degrees. So such a phase-anisotropic IDT, becomes to be a "positive" quadrature-phased bi-directional IDT", where the term "positive" indicates the construction 80 is based on symmetrical IDT topology 76. In this case, the phase conditions for SAW waves emerging are observed only at the left. And, by reciprocity, for SAW waves incident from the left the phase conditions of the SAW wave reflections absence are observed. The phase alignment, achieved by this technique, is the same for wide frequency spectrum in contrast to prior art 70 manner of deposing the U-type 3 dB-MSC, where exact alignment is true for the only frequency point. We call an inter-digital transducer, represented by the construction 80, as a "positive unidirectional-in-wide-frequency-range transducer", where the term "positive" indicates the construction 80 is based on symmetrical IDT topology 76.

Figure 8A:
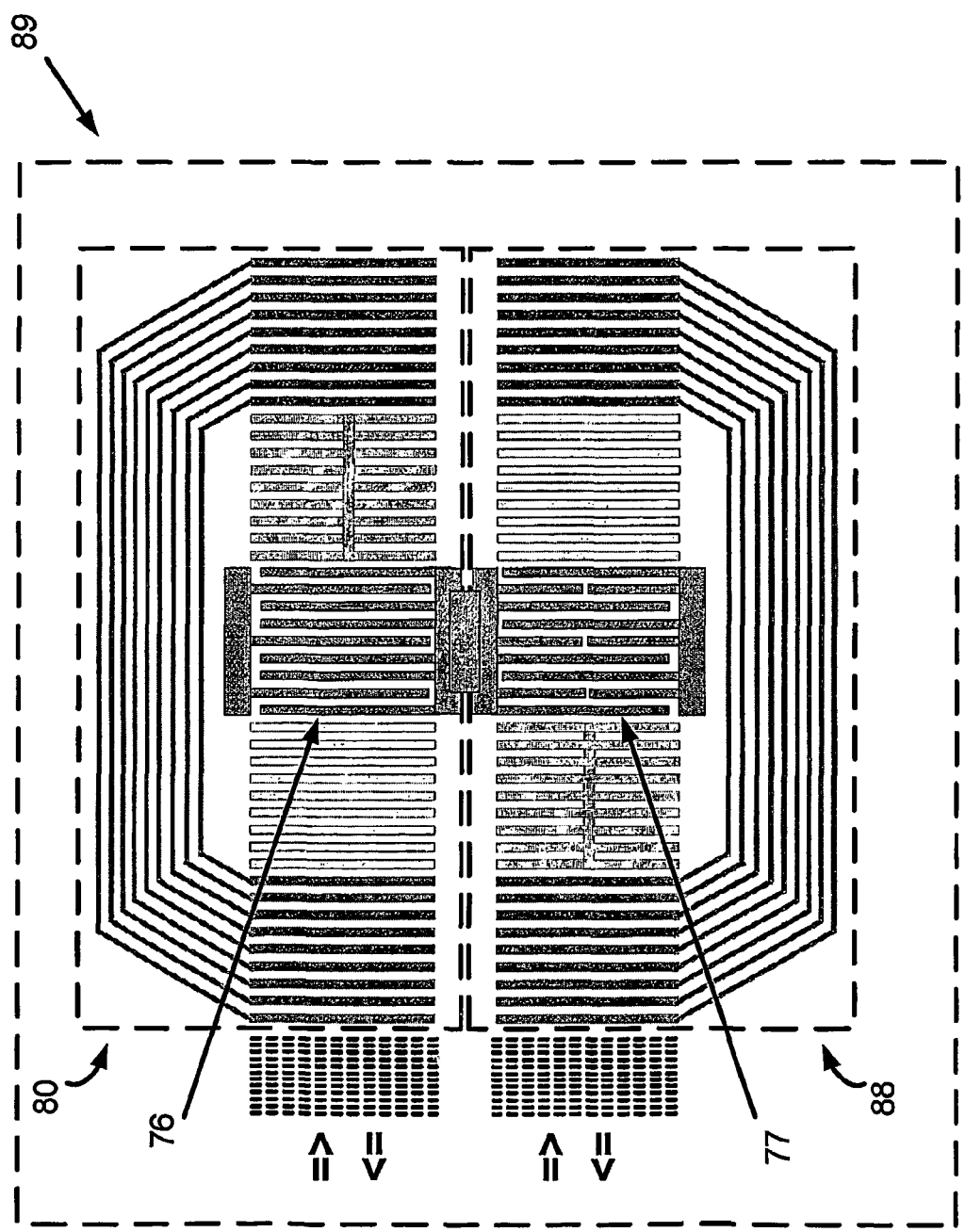
FIG. 8a shows an exemplary embodiment of the present invention, comprising a cascade construction containing the combinations of U-type 3 dB-MSC and two SAW wave-guides having different quantity of isolated fingers for transformation of both: symmetrical and asymmetrical bi-directional SAW IDT to unidirectional SAW IDT.

Another construction 88, shown in FIG. 8a, as an exemplary embodiment of the present invention. is also unidirectional in wide frequency range and differs from the construction 80 by the fact that IDT 77 is asymmetrical and the uni-direction is defined in the direction where the zebra SAW wave-guide having less isolated fingers is arranged. We call an inter-digital transducer, represented by the construction 88, as a "negative unidirectional-in-wide-frequency-range transducer", where the term "negative" indicates the construction 88 is based on asymmetrical IDT topology 77.

A combination 89 of the constructions 80 and 88 connected in parallel represents an IDT 89, which is unidirectional in wide frequency range and has electrode fingers configured symmetrically within the part 80 and asymmetrically within the part 88.

Referring again to FIG. 8, the following construction is similar to construction 80 and not shown in the drawings separately. This construction, as an exemplary embodiment of the present invention, is an anisotropic IDT, wherein a bi-directional IDT has topology, which is neither symmetrical nor asymmetrical, i.e. the bi-directional IDT fingers topology comprising: symmetrical and asymmetrical components. Wherein the difference between the quantities of the isolated fingers of the two zebra SAW wave-guide is equal to the quantity of the U-type 3 dB-MSC's strips, the anisotropic IDT turns into quadrature-anisotropic IDT, i.e. an additional relative phase shift between SAW beams propagating on opposite sides of the bi-directional IDT is equal to 90° for symmetrical component and −90° for asymmetrical component. In this case, the phase conditions for SAW waves emerging are observed only at the left of the quadrature-anisotropic IDT for symmetrical component of the bi-directional IDT and only at the right of the quadrature-anisotropic IDT for asymmetrical component of the bi-directional IDT.

7. Delay-Line with SAW Beam Transformation.

Figure 9:
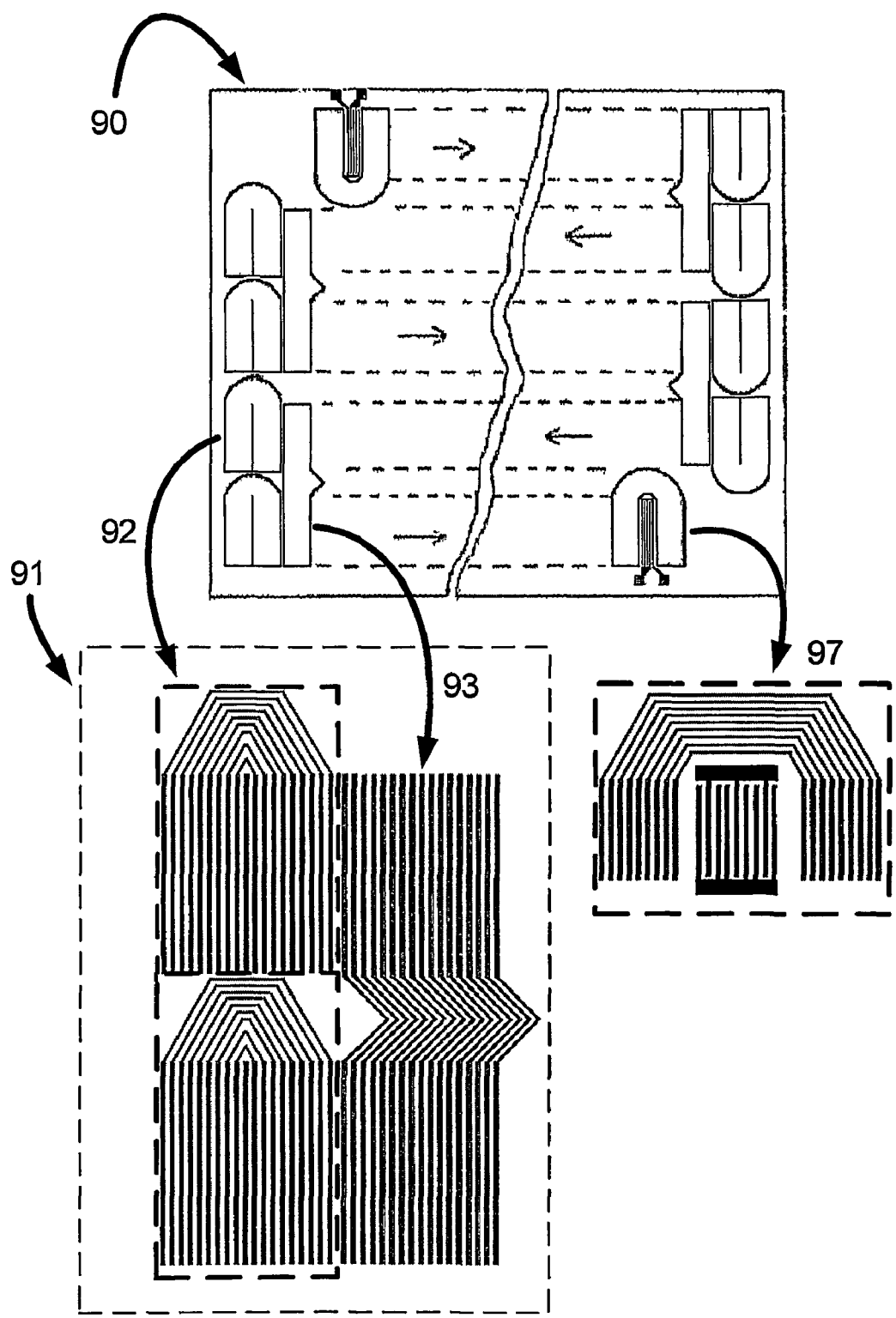
FIG. 9 shows a prior art device with eight track-changers, giving big delay of SAW beam.

FIG. 9 shows prior art device 90 comprising two unidirectional transducers 97 and eight track-changers 91, providing a long delay for the SAW beam. The unidirectional IDT 97 is the same as the prior art IDT 70 shown in FIG. 7 and described above. The track-changer 91 consists of two U-type 3 dB-MSC 92, which are similar to U-type 3 dB-MSC 75, with the absence of the IDT between their arms, thus, function as mirrors for SAW beams. In addition there are 3 dB-MSCs 93, which transfer the SAW beam from track to track. Such a construction 90 is not guarded from SAW wave diffraction spreading thus the direction over the substrate of the SAW propagation should be of "minimal-diffraction". The requirement of a specific substrate cut and direction of "minimal-diffraction" limits the selection of the SAW propagation direction on another two significant parameters, the direction of the greatest temperature stability and the direction of the most appropriate coupling coefficient. Moreover, the transducers 97 are completely unidirectional only for one specific frequency.

Figure 10:
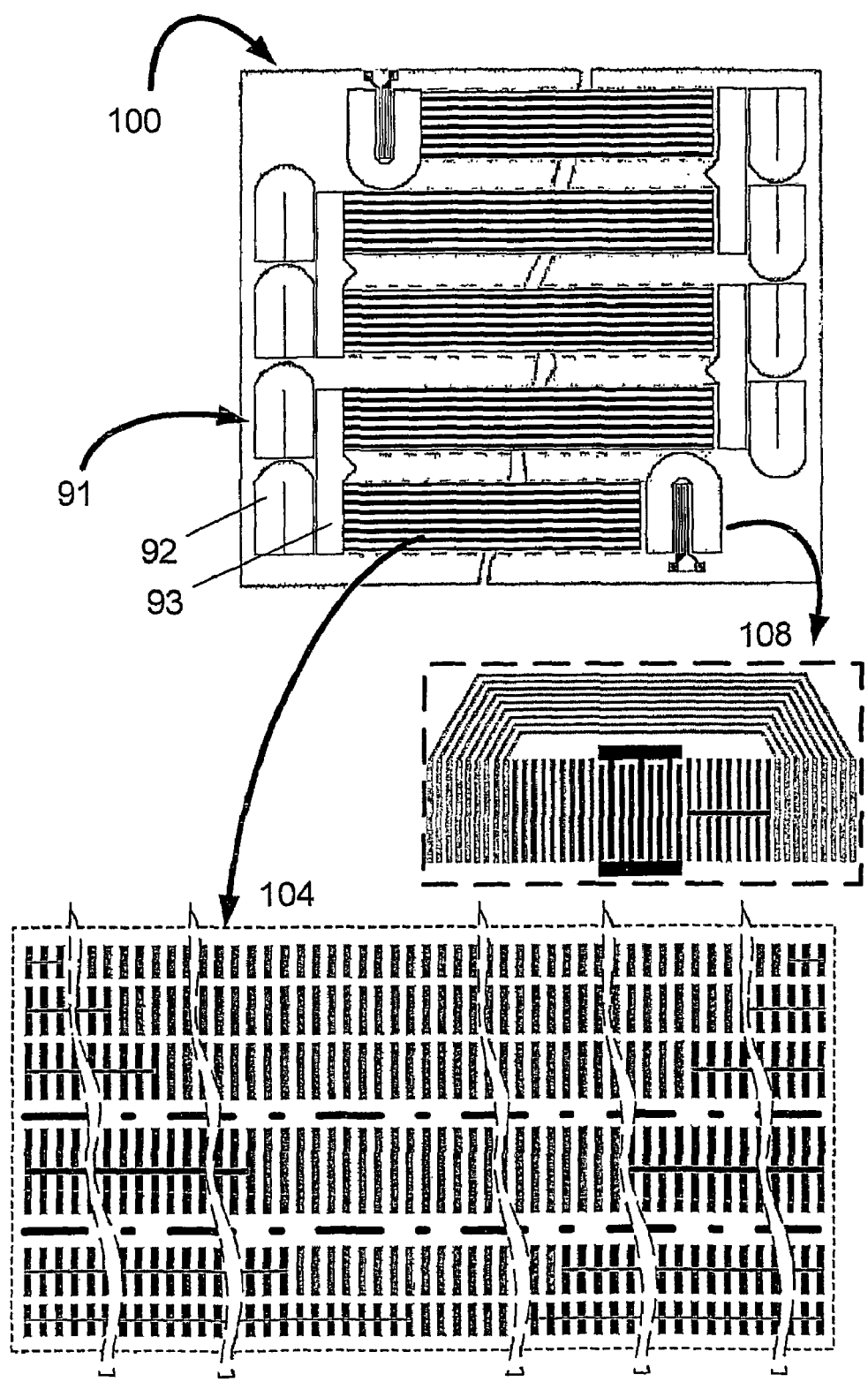
FIG. 10 shows an exemplary embodiment of the present invention, comprising a SAW filter based on long delay-line, wherein SAW beam is transformed on its path form transducer to transducer.

FIG. 10 shows an exemplary embodiment of the present invention, comprising a construction of SAW filter 100 based on long delay-line, wherein SAW beam is transformed form transducer to transducer. In this exemplary embodiment of the present invention, a long delay-line 100, comprising a combination of prior art device 90 and set 104 of zebra SAW wave-guides 41–46 (shown in FIG. 4) with different quantity of isolated electrodes 14. Moreover, prior art transducers 97 are replaced by the constructions 108, which are the same as the construction 80, which above-described in the present invention and shown in FIG. 8. The behavior of the long delay-line 100 for SAW beam is improved in comparison with prior art device 90 in three aspects:

a) Providing unidirectivity of the construction 108 (or 80) in wide frequency spectrum in contrast to prior art transducer 97 (or 70), that is completely unidirectional only for one specific frequency.

b) Substantial reducing the energy spreading of the SAW beam along its way from one transducer to the other, by means of using the inventive wave-guide, which free the demand for specific piezo-substrate's cut by ignoring from the criterion of the direction of minimal-diffraction.

c) improvement of the frequency response by the phase manipulation of the propagating SAW beams. The whole SAW beam is divided into a lot 104 of narrow SAW beams 41, 42, 43, . . . , 44, . . . , 45 and 46. Each narrow beam is weighted by the respective width and delayed by the chosen quantity of isolated electrode fingers in the associated SAW zebra-wave-guide. Such a technique of the SAW beam weighting is equivalent to digital filtration by weights of respective width and delays defined by the quantities of isolated fingers in the associated zebra-wave-guides. In spite of the fact the weights, which are proportional to associated wave-guide width, cannot be implemented with arbitrary resolution, nevertheless the necessary accuracy may be achieved by respectively fine resolution of phase manipulation.

8. Coding by Phase Manipulation.

Figure 9A:
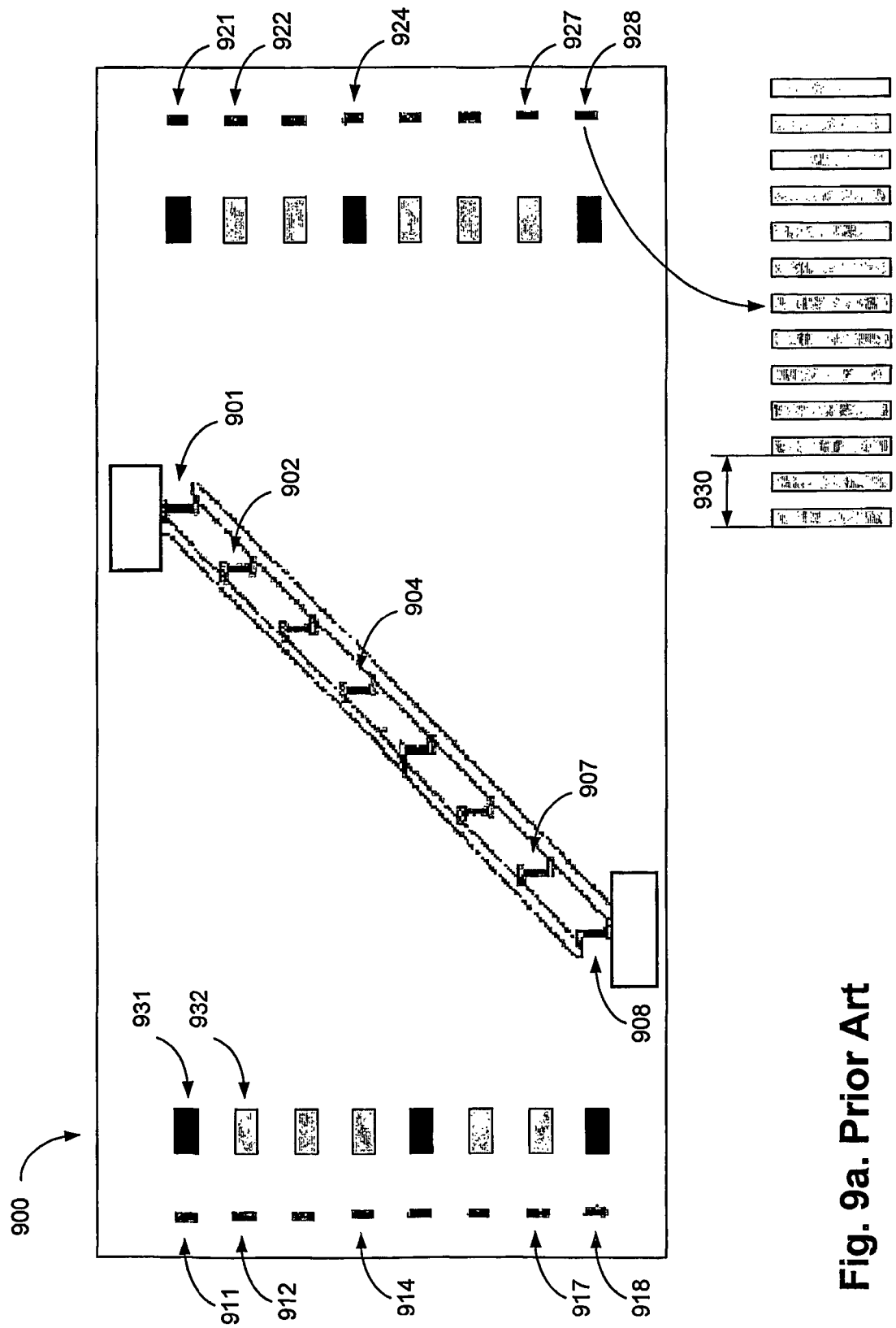
FIG. 9a shows a prior art SAW tag.

The FIG. 9a shows prior art SAW tag 900 comprising set of inter-digital transducers 901–908 shifted from each other into along the direction of the SAW reflectors 911–918, 921–928. Such a constructive is not guarded from the significant diffraction spreading of the SAW waves propagating through the long paths from transducers 901–908 to reflectors 911–918,921–928 and back to associated transducers 901–908. The reflectors 911–918,921–928 comprising arrays of isolated fingers arranged with periodicity of two fingers per wave-length 930. Each track has an initial part that is covered by a metal strip 931,932. Some of the strips are removed, for example 932, by photolithography etching process or by Laser Micro-Machining Systems, thereby providing a desired delay and phase shift of the associated SAW beam. It is thought that the delay and phase shift is due to the fact that the SAW velocity within the metal covered areas differs from the SAW velocity on the free surface space. A unique coding of such tags is achieved by choice of an arrangement of the being present metal strips 931 and removed ones 932. The phase shift, achieved in this way, is further affected by the thickness of the metal layer. The phase shift, achieved by such way, depends on the metal thickness.

Figure 10A:
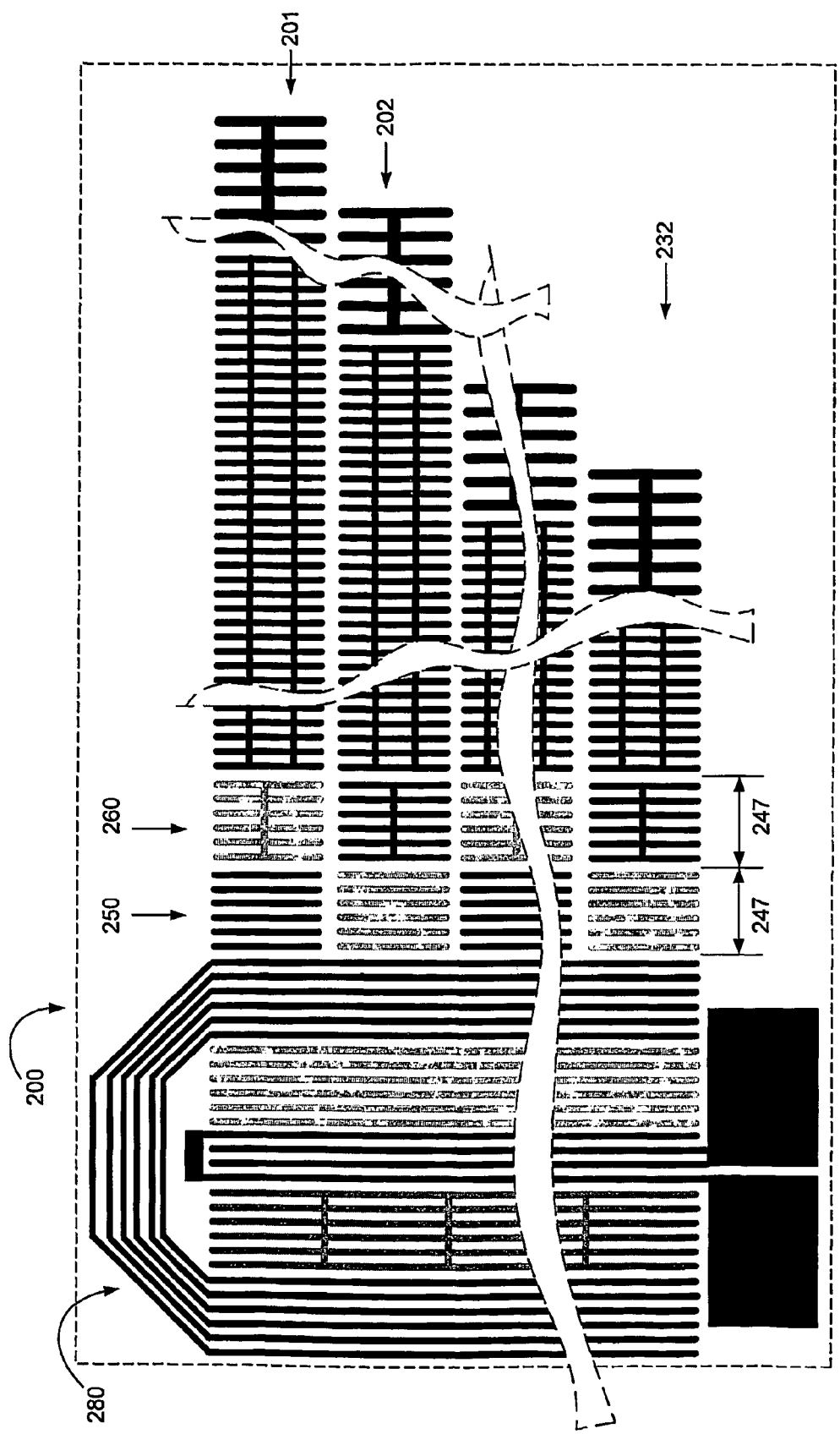
FIG. 10a shows an exemplary embodiment of the present invention, comprising a one-port SAW coding device topology having SAW reflectors.

FIG. 10a shows an exemplary embodiment of the present invention, comprising a construction of one-port SAW coding device 200 which comprises a unidirectional transducer 280, which is the same as the construction 80, described above and shown in FIG. 8. The coding device 200 is based on long delay-lines, wherein SAW beam, launched by the unidirectional transducer 280, is divided to several parallel SAW beams propagating along separated wave-guides 201–232. Each track 201–232, in principle, functions as a kind of complicated permanent wave-guide, having reflecting part, analogously to the complicated permanent zebra-wave-guide 13, shown on FIG. 1a and described above. In addition to the complicated permanent zebra-wave-guide 13 the zebra-wave-guides 201–232 originally have at least one pair of fragments 250 and 260 having the same length 247, and differ by electrical load: one fragment 250 comprises isolated fingers and another fragment 260 comprises electrically shorted fingers. One of the two fragments is removed; thus the delay-defined phase shift of the associated SAW beam can be controlled; for example, wherein the length 247 is equal to $0.5\pi/(Ksc-Koc)$, covered twice, defines 180° phase shift. Either photolithography process or Laser Micro-Machining Systems may perform the fragment removing. The different combinations of the phase manipulations may be obtained to provide a unique coding and such SAW coding device and might be used successfully as a tag. The fragment removing has a generalized meaning, i.e. wholly covering the mentioned fragment by entire metal strip has the same meaning as removing all the fingers to obtain free surface space; wherein it is important to use the same style of removing to every codes. Such technique of coding, provides the same phase shift accuracy independently on choosing of metal material and thickness of fingers in contrast to prior art engineering technique of the phase shift coding by entire metal strips 931,932. Thereby, the coding device 200 has improved characteristics relatively to prior art 900 SAW tag in the following features:
- (a) Use of SAW wave-guides, which substantially reduce the SAW beam diffraction spreading effect by SAW wave-guide effect utilization;
- (b) Application of a technique of coding consisting in use of the inventive pairs of in-line arranged coding zebra type SAW wave-guide fragments, wherein one fragment is of isolated fingers and another is of electrically shorted fingers, that allows a phase coding control with no manufacture deviations; and
- (c) Use of the inventive unidirectional-in-wide-frequency-range IDT above-reported for miniaturization of a SAW device and improvement of characteristics by insertion loss.

Figure 10B:
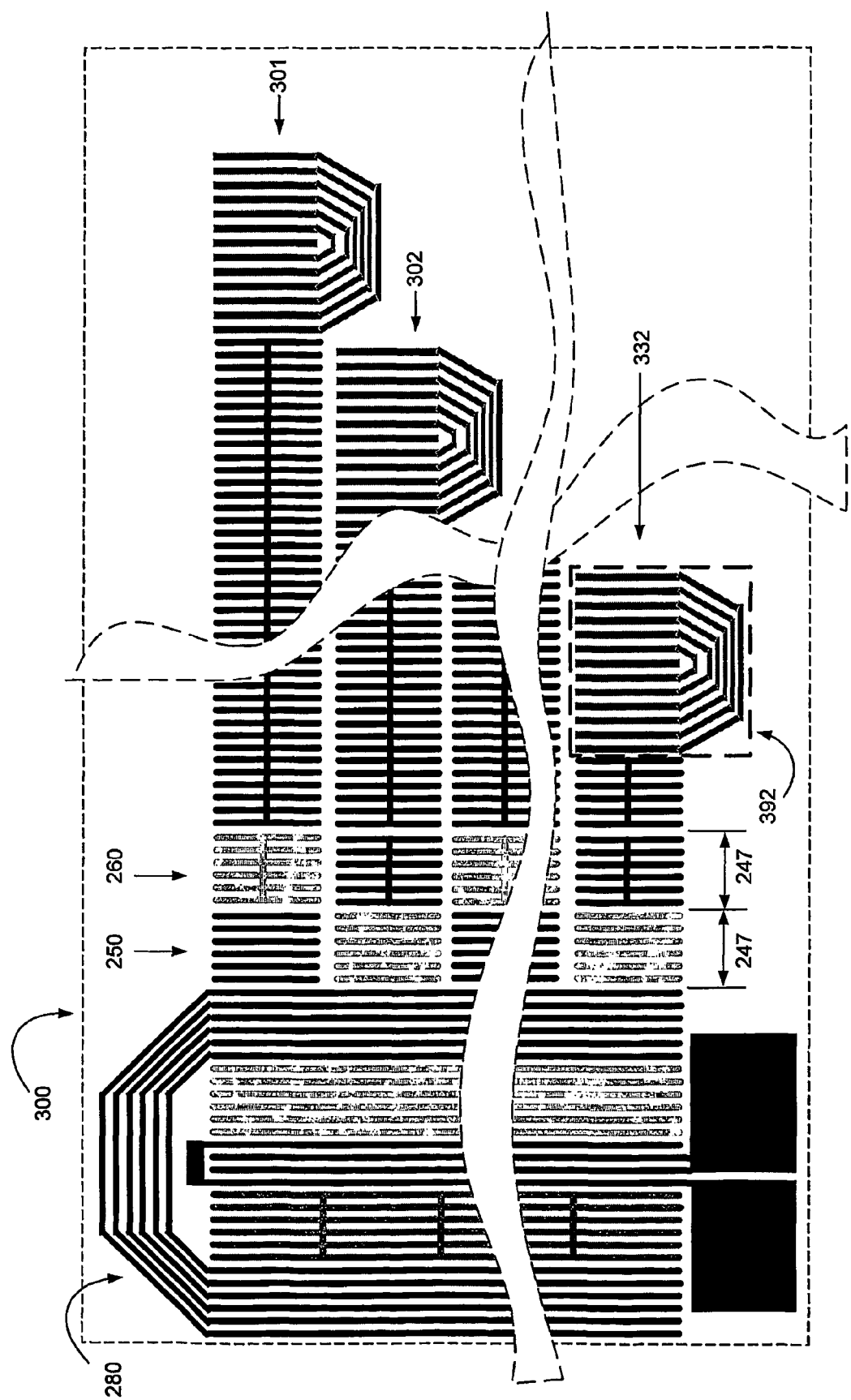
FIG. 10b shows an exemplary embodiment of the present invention, comprising a one-port SAW coding device topology having SAW mirrors.

FIG. 10b shows, as an exemplary embodiment of the present invention, a construction of one-port SAW coding device 300 having wide spectrum, wherein zebra-wave-guides 301–332 differ from the complicated permanent zebra-wave-guides 201–232 shown in FIG. 10a by the fact, that the zebra-wave-guides 301–332 have wide spectrum mirrors 392 instead of narrow band reflecting parts 17 shown in FIG. 1a and described above. The wide spectrum mirrors 392 are the same as the 92, reported in prior art and shown in FIG. 9. Thereby such SAW coding device 300 might be used successfully as a tag having wide frequency spectrum.

9. SAW Transducer as Wave-Guide.

Figure 11:
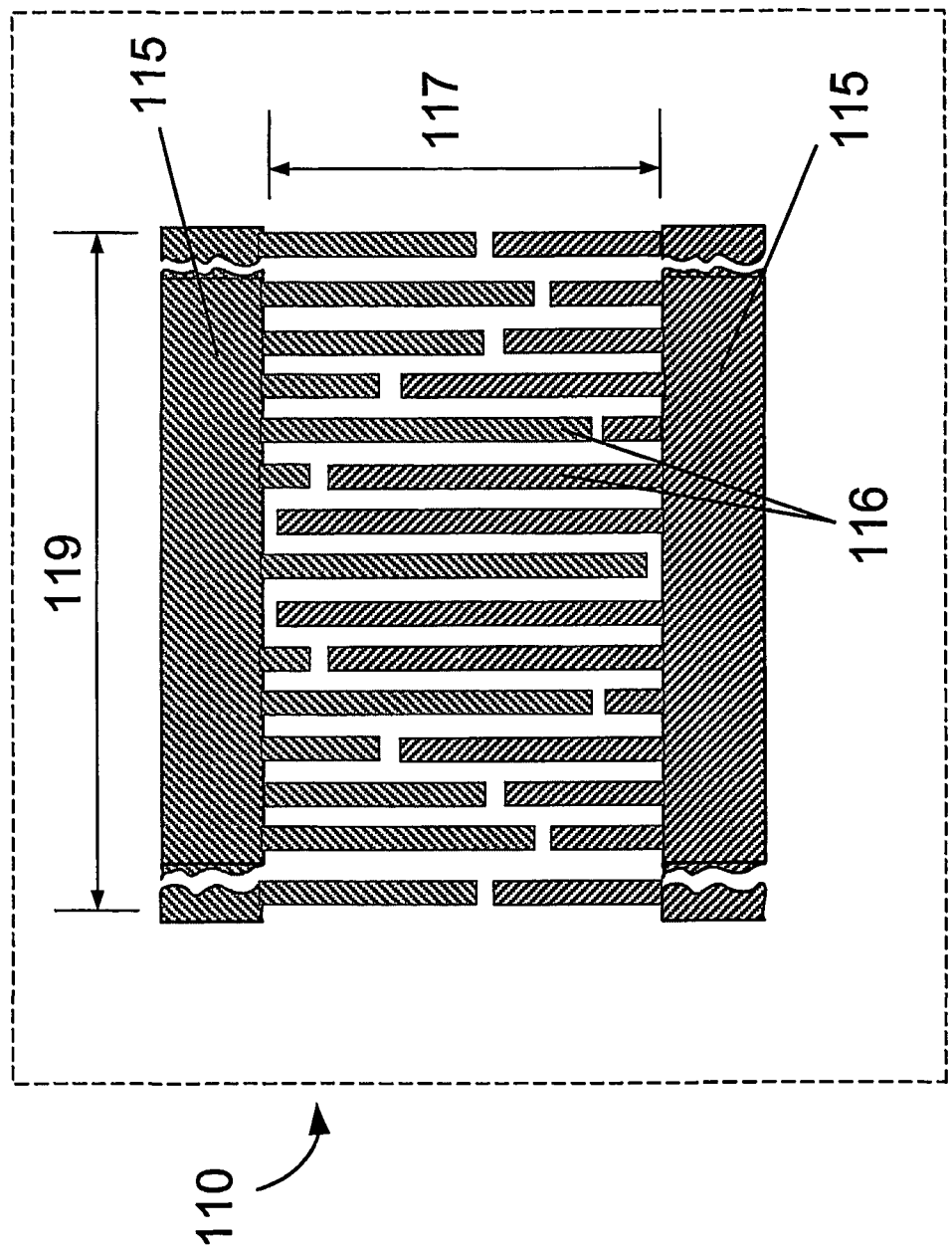
FIG. 11 shows a prior art SAW transducer, having array of electrode fingers uniformly connected to opposite bus bars.

FIG. 11 shows prior art topology of an apodized inter-digital transducer (IDT) 110. Such an IDT can launch/detect a SAW beam of width 117. If the value 117 is much greater than $\lambda$ and if the length 119 of the IDT is not longer than approximately 300 $\lambda$, the consideration of the SAW beam, propagating inside the IDT, as beam, having front that is parallel to electrode fingers 116, is justified. In practice, for example, the use of IDT with length 119 of more than 300 $\lambda$, ignoring effects of the SAW beam diffraction spreading in the IDT topology synthesis procedure, leads to distortion of the frequency characteristics shape. In order to improve the IDT characteristics, a constructive solution 120 for the IDT topology design, illustrated in FIG. 12. may be applied.

Figure 12:
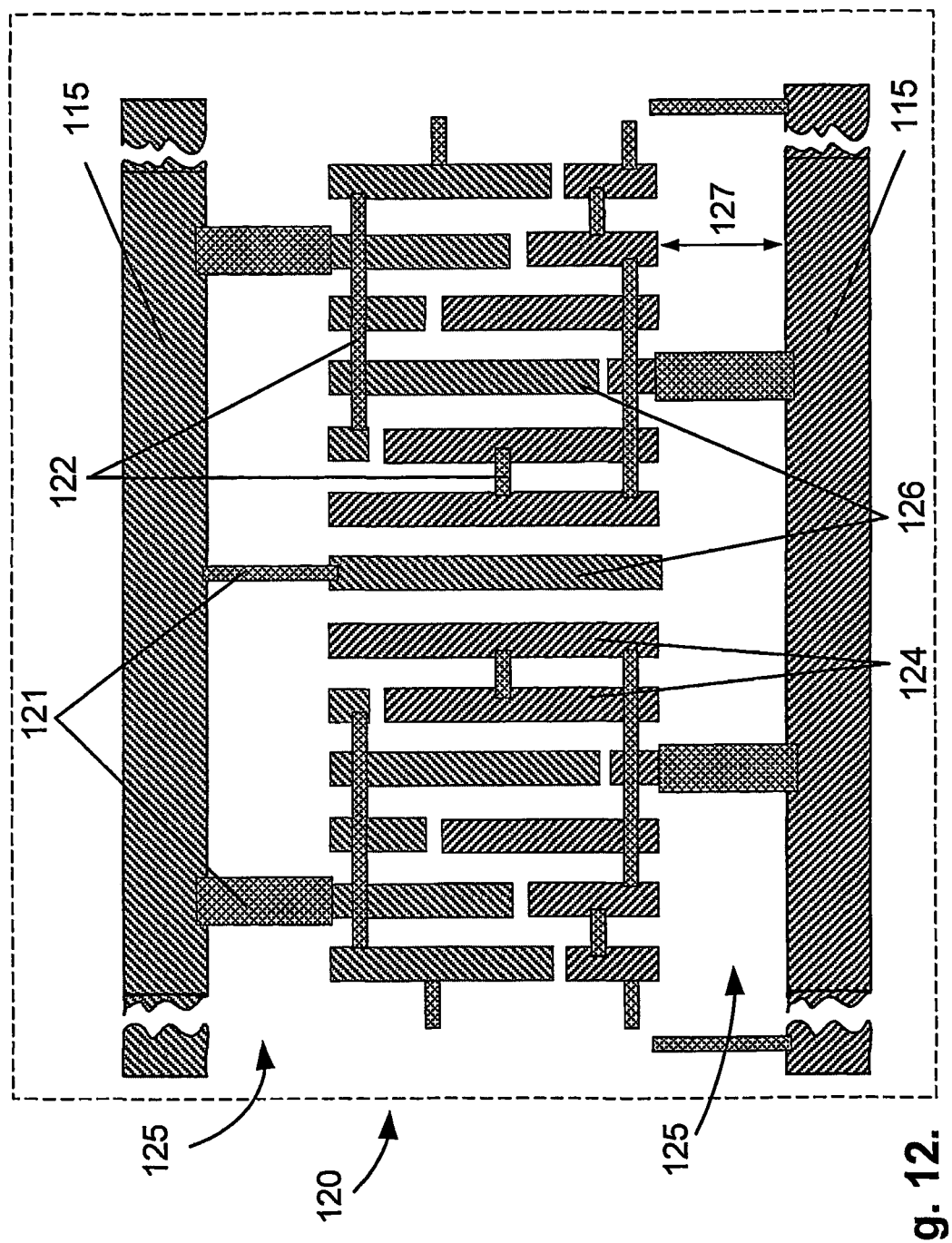
FIG. 12 shows an exemplary embodiment of the present invention, comprising a SAW transducer, implemented as SAW IDT-wave-guide having free surface spaces in the both sides along the direction of the SAW beam propagation.

FIG. 12 shows, as an exemplary embodiment of the present invention, a SAW IDT topology 120, configured as SAW "IDT-wave-guide" with important substantially wide free surface spaces 125, which border the array of the interdigitized electrode fingers 124 and 126. Value of the free surface space width 127 comes to several $\lambda$. These free surface spaces arise as result of omission of the direct connections 121 between opposite bus bars 115 and inter-digitized electrode fingers 124 or 126. At the same time, on the one hand, the equipotentiality of the electrode fingers 124, and, on the other hand, equipotentiality of the electrode fingers 126, are provided by the internal connection squares 122 having substantially small size, in order not to disturb wave front of a propagated SAW beam.

10. SAW Filter Topology as a Permanent Wave-Guide.

Figure 13:
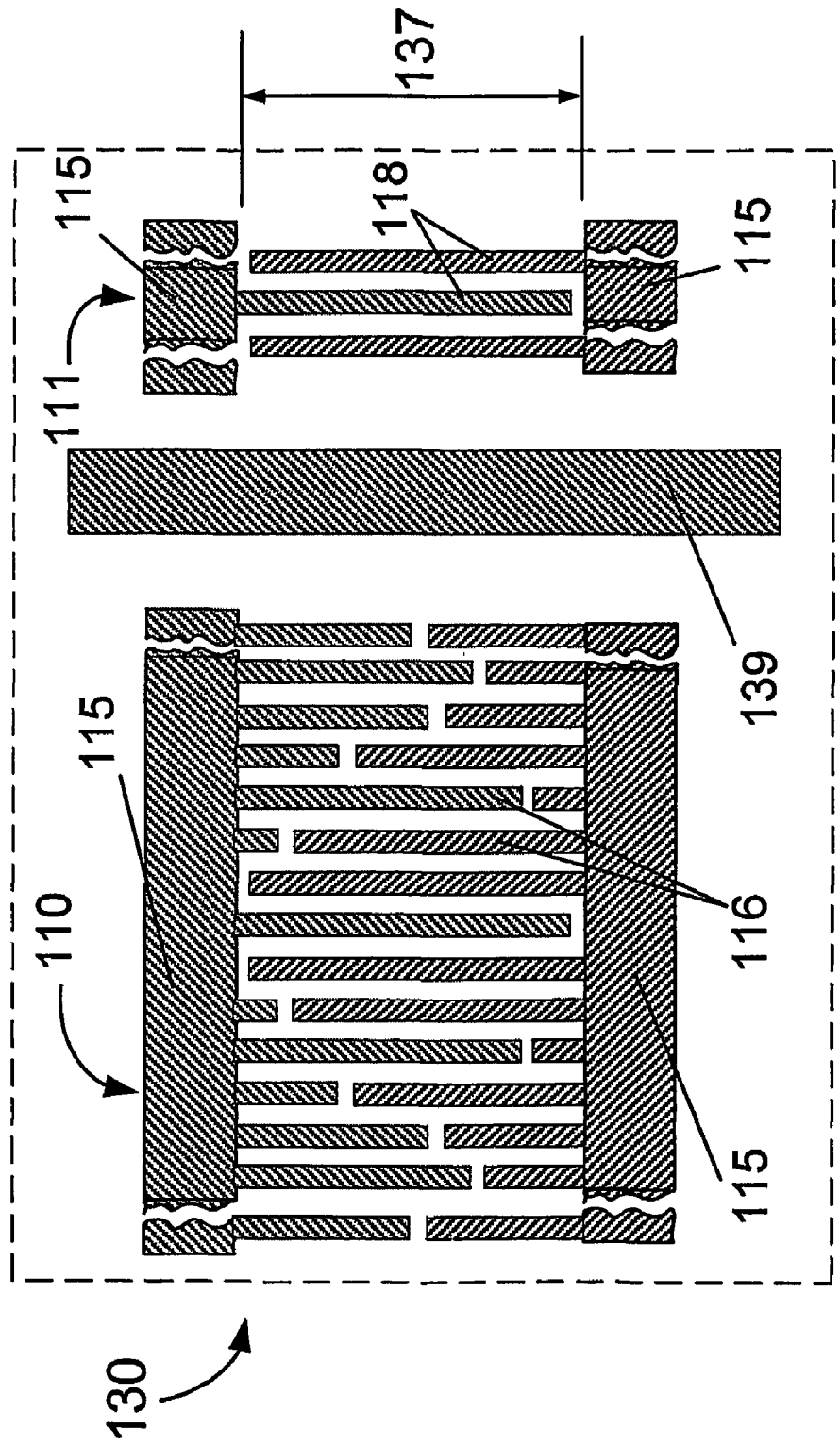
FIG. 13 shows a prior art SAW filter containing two (input and output) inter-digital transducers (IDT) distanced from each other.

FIG. 13 shows prior art SAW filter 130 topology, containing two IDT 110 and 111 disposed in-line one against another. The SAW wave, launched by one of them, is detected by another. The SAW filter topology synthesis problem is easier, if only one of IDT, here 110, has electrode fingers 116 weighted by length and another IDT, here 111, has all the electrode fingers 118 overlapping with full aperture 137 of IDT 111. Wide grounded electrode 139 is arranged between IDT 110 and IDT 111 in order to reduce unwanted signal leakage directly from-IDT-to-IDT without piezo-transformation to SAW wave. The SAW beam diffraction spreading along the entire propagation path, i.e. inside of both IDT 110 and IDT 111 and along the way between IDT 110 and IDT 111, causes the diffraction loss and unwanted distortion of the SAW filter characteristics shape.

Figure 14:
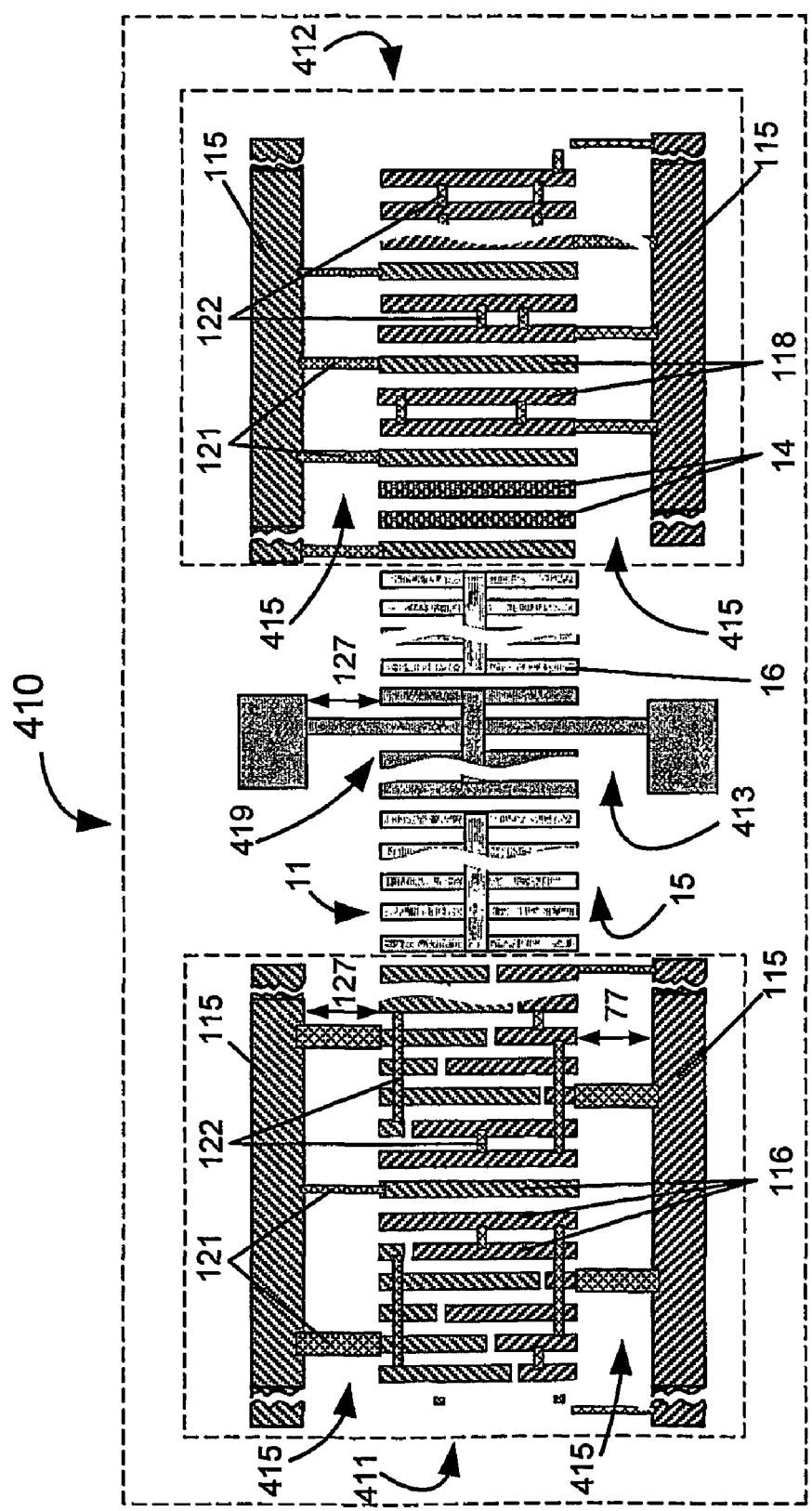
FIG. 14 shows an exemplary embodiment of the present invention, comprising a SAW filter, wherein both input and output IDT and space between them are implemented as a permanent SAW wave-guide having important free surface spaces in the both sides along the direction of the SAW beam propagation.

FIG. 14 illustrates, as an exemplary embodiment of the present invention, a constructive solution for the SAW filter 410 topology design that provides the improving the SAW filter characteristics. This constructive solution 410 consists in the designing of all the components: IDT 411, IDT 412, grounded screen 419 between IDT 141 and IDT 142, and all the remained spaces between IDT 411 and IDT 412 in form of a permanent SAW wave-guide bordered with important free surface spaces 415, 413 and 15. The value 127 of the free surface spaces 415,413 and 15 border comes to several $\lambda$.

11. Extraction of Narrow Track to Separate Narrow IDT-Wave-Guide.

FIG. 15 shows prior art SAW inter-digital transducer 500 topology, having a symmetrical apodization that defines the main lobe 501, left side lobes 511, 512–515 and right side lobes 521–525 by an imaginary apodization line 555. FIG. 15a shows how the imaginary apodisation line 555 defines interdigitized fingers' overlaps. A narrow imaginary track 550 has a lot of small overlaps of interdigitized fingers. In practice, a behavior of SAW beams within such a narrow track is difficult for analysis because of diffraction spreading and electrostatic transverse end-effect.

FIG. 16 illustrates, as an exemplary embodiment of the present invention, a constructive solution for "combined-IDT" 600 topology design that provides the improving the SAW IDT characteristics. This combined-IDT 600 constructive solution consists in extraction of the narrow imaginary SAW track 550 from prior art apodized IDT construction 500, shown in FIG. 15, and in implementation of the both: track 550 as a separate narrow apodized IDT-wave-guide 650 and remained parts 541 and 542 of IDT 500 as the main-IDT 640, wherein the aperture 617 of the main-IDT 640 is equal to the sum of apertures 517 and 518 of the remained parts 541 and 542 respectively. The main-IDT 640 and the apodized narrow IDT-wave-guide 650 are electrically connected in parallel constituting the combined-IDT 600. The narrow apodized IDT-wave-guide 650 has rarefied space borders 615 and interdigitized fingers weighted by length that is shown in FIGS. 16a and 16b as an exemplary embodiment of present invention. It is justified to ignore a SAW beam diffraction spreading for the apodized narrow IDT-wave-guide 650 and so such a construction is easier for analysis that allows achieving SAW filters of high precision characteristics. Note that in the case of the implementation of narrow SAW track as a narrow wave-guide, weighting of the narrow wave-guide topology by a withdrawal weighting technique is in principal more accurate than a withdrawal weighting technique for inter-digital transducer having a main lobe of whole aperture. In principal more accurate implementation of the weights is defined by respectively small difference between weights of the narrow part of the main lobe and the far small side lobes. The fragment 820 in FIG. 18 illustrates schematically another implementation of the narrow IDT-wave-guide topology weighting by a withdrawal weighting technique, where fingers 816 are isolated.

12. Miniaturization of SAW Filter Topology.

FIG. 17 schematically illustrates prior art use of SAW filter 700 topology having two apodized IDT 701 and 702 and MSC 703. Such a structure has increased unwanted expenditure of free piezo-substrate areas 704 and 705.

Figure 18:
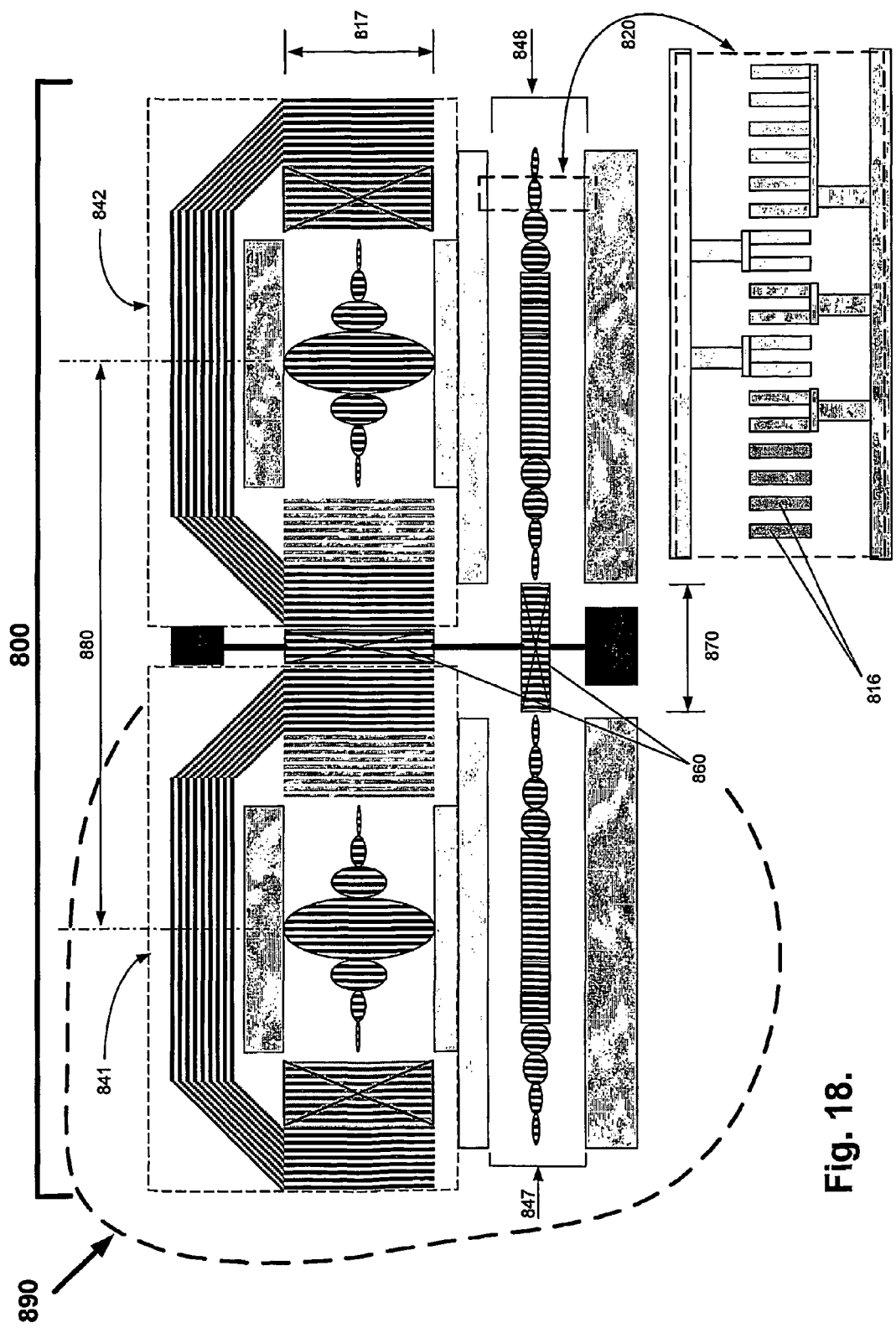
FIG. 18 shows an exemplary embodiment of the present invention, comprising an extremely miniaturized two-track SAW filter topology, where the main track has unidirectional-in-wide-frequency-range transducers, and the narrow track has narrow IDT-wave-guides having weighted topology.

A miniaturization of SAW filter topology, having both launching and detecting apodized IDT, and, at the same time, an improvement of characteristics by decreasing insertion loss are achieved by a constructive solution for SAW filter topology 800, shown in FIG. 18 as an exemplary embodiment of the present invention.

The SAW filter construction 800 comprises two "partially-unidirectional-combined-IDTs" 890, which are exemplary embodiments of the present invention. Here the unidirectional-in-wide-frequency-range main-IDTs 841 and 842 are constructed utilizing the present invention idea illustrated in FIG. 8 and explained hereinabove. In this case, SAW waves, are launched by interdigitized fingers of apodized main-IDT topology 841, twice propagate through 3-dB MSC: on output from the main-IDT 841 and on input into the main-IDT 842, thereby transforming a non-uniform SAW beam front to uniform one and reach with already the uniform SAW beam front the apodized main-IDT's 842 interdigitized fingers.

The launching and detecting IDT-wave-guides 847 and 848 of small aperture have quasi-uniform front of SAW beam, propagating there, because of wave-guide effect, so there is no necessary to use neither MSC nor withdrawal weighting technique in such a narrow track.

Note, that use of withdrawal weighting technique for weighting a topology of a narrow IDT-wave-guide may have additional advantages; this was explained hereinabove that the implementation of the narrow IDT-wave-guide topology withdrawal weighting almost does not loss a weighting accuracy, and, on the other hand, the narrow IDT-wave-guide withdrawal weighting is easier for manufacture embodiment. Fragment 820 illustrates a withdrawal weighting technique using isolated fingers 816 for narrow IDT-wave-guide as an exchangeable variant for a topology apodization.

The unidirectional-in-wide-frequency-range main-IDTs 841 and 842 have an aperture 817, which is equal to half of the aperture 617 of the bi-directional main-IDT 640. A grounded screen 860 is implemented as a SAW wave-guide as well.

The distance between the two partially-unidirectional-combined-IDT topologies 890 is reduced observing an engineering rule that the distance 870 should not be less than 1.5 of corresponding aperture, in order to avoid a signal leakage effect; wherein observing the engineering rule, the distance may be reduced in principal, because an aperture of said narrow IDT-wave-guide is more less than an aperture of said original apodized IDT topology. Thus, the utilization of launching and detecting IDT-wave-guides 847 and 848 of small aperture causes a decreased unwanted signal leakage effect that allows an additional miniaturization of SAW device 800 by reduction of distance 870 between the IDT-wave-guides 847 and 848, wherein it is important reduction of an additional expenditure of a piezo-substrate area.

As a result, extremely reduced a distance 880 between centers of the unidirectional-in-wide-frequency-range main-IDTs 841 and 842 defines an extremely decreased time-delay of SAW wave signal; it is important reduction of the unwanted time delay of SAW wave signal as well.

The ideal external circuits matching, causing an extremely decreased insertion loss with no distortion characteristics in wide frequency range due to use of such a unidirectional-in-wide-frequency-range transducers, that provides canceling a parasite triple-transit signal within the track, having the main part of SAW signal.

It should be understood that the above-described exemplary embodiments are merely for purposes of illustrating the teachings of the present invention and should in no way be used to unnecessarily narrow the interpretation of or be construed as being exclusively definitive of the scope of the claims which follow. It is anticipated that one of skill in the art will make many alterations, recombinations and modifications to the embodiments taught herein without departing from the spirit and scope of the claims.

I claim:

1. A one-channel zebra-wave-guide implemented as an array of interdigitized electrode fingers, wherein said array comprises:
   (a) at least one inter-finger connector, providing electrical shorting of interdigitized electrode fingers, wherein said inter-finger connector is arranged either within and/or outside of said array, wherein size of said inter-finger connector is substantially small in direction perpendicular to direction of a SAW beam propagation, wherein said size is less than half a $\lambda$, where $\lambda$ is a SAW wave-length at a desired frequency;
   (b) borders on both sides along direction of said SAW beam propagation, wherein each of said borders comprises a substantially wide free surface, wherein said substantially wide free surface is wider than half of said $\lambda$; and
   (c) at least two interdigitized electrode fingers, which are periodicallyadapted arranged for providing in-phase summing of partial SAW waves reflected from said at least two interdigitized electrode fingers at said desired frequency.

2. Method for an improved SAW wave-guide effect, comprising:
   (a) providing a SAW wave-guide as an array of interdigitized electrode fingers;
   (b) providing said array's borders along the SAW wave-guide way, wherein said borders comprise substantially wide free surface space, and wherein said wide free surface space is wider than half of $\lambda$, where $\lambda$ is a SAW wave-length at a desired frequency, and
   (c) providing internal inter-finger connectors, arranged either within said array's area and/or close to the edges of said fingers, thereby providing a desired electrical equipotentiality of the array's electrode fingers, wherein said connectors have a substantially small size in the direction perpendicular to the direction of the SAW waves' propagation, and wherein said small size is less than three $\lambda$.

3. A method according to claim 2, for transformation of an original IDT to a SAW IDT-wave-guide wherein utilization of free surface space borders made between an array of interdigitized electrode fingers and opposite bus bars comprises omission of direct connections between interdigitized fingers and bus bars, and whereby forming said free surface space borders and desired equipotentiality of fingers is provided by inter-finger connectors made within the area of the array of interdigitized electrode fingers.

4. An aggregation of arranged in series of at least three SAW device components, wherein at least two said components comprise by zebra-wave-guides, having different quantities of isolated electrode fingers and at least one said component comprises by a combination of at least one of the following SAW device components: SAW wave-guide, SAW reflector, SAW detector and/or SAW launcher.

5. A phase-anisotropic bi-directional IDT comprising by an aggregation, according to claim 4, wherein said aggregation comprises a bi-directional IDT; wherein said bi-directional IDT is arranged between two said zebra-wave-guides and a different quantities of isolated fingers between the opposing zebra-wave-guides provide an additional relative phase shift between SAW beams, propagating on opposite sides of said bi-directional IDT.

6. A quadrature-phased bi-directional IDT copmrising by a phase-anisotropic bi-directional IDT, according to claim 5; wherein said different quantities of isolated fingers between the opposing zebra-wave-guides, taking place into the structure, provide an additional 90-degree relative phase shift between SAW beams, propagating on opposite sides of said bi-directional IDT.

7. A positive quadrature-phased bi-directional IDT, wherein said positive quadrature-phased bi-directional IDT comprises by a quadrature-phased bi-directional IDT, according to claim 6, wherein said bi-directional IDT, being a constructive part of said quadrature-phased bi-directional IDT, has only electrode fingers configured mirror-symmetrically around the bi-directional IDT's center vertical axis.

8. A negative quadrature-phased bi-directional IDT, wherein said negative quadrature-phased bi-directional IDT comprises by a quadrature-phased bi-directional IDT, according to claim 6, wherein a bi-directional IDT, being a constructive part of said quadrature-phased bi-directional IDT, has only electrode fingers configured antisymmetrically around the bi-directional IDT's center vertical axis.

9. An anisotropic IDT comprising by a combination of a U-type 3 dB MSC and a phase-anisotropic bi-directional IDT, according to claim 5; wherein said phase-anisotropic bi-directional IDT is arranged between arms of the U-type 3 dB MSC, that provides said anisotropic IDT's anisotropic directivity for launched and detected SAW waves.

10. A quadrature-anisotropic IDT comprising by an anisotropic IDT, according to claim 9, wherein the opposing zebra-wave-guides, taking place into the structure, have different quantities of isolated fingers adapted for providing an additional 90-degree relative phase shift between SAW beams propagating on opposite sides of said bi-directional IDT, that provides the anisotropic directivity is such that a symmetrical component of said bi-directional IDT, launches and detects SAW waves, which propagate out of said quadrature-anisotropic IDT only on side of that from the two opposing zebra-wave-guides, which has more isolated fingers, and an antisymmetrical component of said bi-directional IDT launches and detects SAW waves, which propagate out of said quadrature-anisotropic IDT only on side of that from the two opposing zebra-wave-guides, which has less isolated fingers.

11. A positive unidirectional-in-wide-frequency-range transducer comprising by a quadrature-anisotropic IDT, according to claim 10, wherein said bi-directional IDT has only symmetrically configured electrode fingers, that provides directivity of said positive unidirectional-in-wide-frequency-range transducer in the direction to that from the two opposing zebra-wave-guides, taking place in the structure, which has more isolated fingers.

12. A SAW positive partially-unidirectional-combined-IDT topology represented by a SAW component having at least two tracks, wherein at least one said SAW track comprises a bi-directional SAW IDT-wave-guide comprising:
(a) at least one inter-finger connector for providing a desired equipotentiality of at least two fingers, i.e. there are fingers connected to one of the opposite bus bars only through said inter-finger connector arid another finger, wherein said inter-finger connector, arranged either within and/or outside of said array, has substantially small size in the direction, perpendicular to the direction of SAW beam propagation, wherein said small size is less than three λ, where λ is a SAW wave-length at a desired frequency; and
(b) IDT's free surface space borders arranged between interdigitized electrode fingers array and opposite bus bars, wherein at least one said border comprises a substantially wide free surface space, wherein said wide free surface space is wider than half of said λ, wherein said free surface space borders are achieved by omission of direct connectors between interdigitized fingers and said opposite bus bars;
and wherein at least one said SAW track comprises said positive unidirectional-in-wide-frequency-range transducer, according to claim 11.

13. A negative unidirectional-in-wide-frequency-range transducer comprising by a quadrature-anisotropic IDT, according to claim 10, wherein said bi-directional IDT has only antisymmetrically configured electrode fingers, that provides directivity of said negative unidirectional-in-wide-frequency-range transducer in the direction to that from the two opposing zebra-wave-guides, taking place in the structure, which has less isolated fingers.

14. A SAW negative partially-unidirectional-combined-IDT topology represented by a SAW component having at least two tracks, wherein at least one said SAW track comprises a bi-directional SAW IDT-wave-guide, comprising:
(a) at least one inter-finger connector for providing a desired equipotentiality of at least two fingers, i.e. there are fingers connected to one of the opposite bus bars only through said inter-finger connector and another finger, wherein said inter-finger connector, arranged either within and/or outside of said array, has substantially small size in the direction, perpendicular to the direction of SAW beam propagation, wherein said small size is less than three λ, where λ is a SAW wave-length at a desired frequency; and
(b) IDT's free surface space borders arranged between interdigitized electrode fingers array and opposite bus bars, wherein at least one said border comprises a substantially wide free surface space, wherein said wide free surface space is wider than half of said λ, wherein said free surface space borders are achieved by omission of direct connectors between interdigitized fingers and said opposite bus bars;
and wherein at least one said SAW track comprises said negative unidirectional-in-wide-frequency-range transducer, according to claim 13.

15. A unidirectional-in-wide-frequency-range transducer represented by a SAW component, having at least two tracks,
wherein at least one said track comprises a quadrature-anisotropic IDT, according to claim 10, wherein said bi-directional IDT has only symmetrically configured electrode fingers, that provides directivity of said track in the direction to that from the two opposing zebra-wave-guides, taking place in the structure, which has more isolated fingers,
and wherein at least one said track comprises said quadrature-anisotropic IDT, wherein said bi-directional. IDT has only antisymmetrically configured electrode fingers, that provides directivity of said track in the direction to that from the two opposing zebra-waveguides, taking place in the structure, which has less isolated fingers.

16. A SAW MSC-wave-guide comprising double-length MSC, wherein said 20 double-length MSC provides both: transforming SAW beam of non-uniform front to uniform one and keeping of the SAW beam in the same track, by means of MSC-effect of the SAW beam transmitting from-track-to-track-and-back.

17. A SAW wave-guide compressor/expander, wherein said SAW wave-guide compressor comprises a combination of 3 dB MSC and a set of two parallel zebra-wave-guides, wherein the following constructive features take place:
   (a) said 3 dB MSC has fingers aligned with the same line in both SAW tracks, having equal aperture;
   (b) both of said two parallel zebra-wave-guides have the same width equal to said track's aperture;
   (c) both of said two parallel zebra-wave-guides have the same periodicity of finger arrangement;
   (d) both of said two parallel zebra-wave-guides have the same total quantity of fingers; and
   (e) said two parallel zebra-wave-guides have different quantities of isolated fingers, wherein said different quantities of isolated fingers provides 90-degree relative phase shift between phases of SAW beams, propagated through said two parallel zebra-wave-guides.

18. A SAW MSC-waveguide comprising pair of mirrored said SAW wave-guides: expander and compressor, which are recited in claim 17, wherein said two mirrored SAW waveguides: compressor and expander are arranged in such a manner, that both of said 3 dB MSC are outside, that provides both: transforming the primary SAW beam of non-uniform front with width equal to the width of one zebra-wave-guide, taking place into the structure, to a uniform one and keeping of the SAW beam in the same track, by means of internal expanding-compressing of the SAW beam.

19. A SAW IDT-wave-guide with an inter-digital transducer having topology comprising:
   (a) at least one inter-finger connector for providing a desired equipotentiality of at least two fingers, i.e. there are fingers connected to one of the opposite bus bars only through said inter-finger connector and another finger, wherein said inter-finger connector, arranged either within and/or outside of said array, has substantially small size in the direction, perpendicular to the direction of SAW beam propagation, wherein said small size is less than three $\lambda$, where $\lambda$ is a SAW wave-length at a desired frequency; and
   (b) IDT's free surface space borders arranged between interdigitized electrode fingers array and opposite bus bars, wherein at least one said border comprises a substantially wide free surface space, wherein said wide free surface space is wider than half of said $\lambda$, wherein said free surface space borders are achieved by omission of direct connectors between interdigitized fingers and said opposite bus bars.

20. A SAW combined-IDT topology represented by a SAW component having at least two track SAW component tracks, wherein at least one track comprises a SAW IDT-wave-quide, according to claim 19, and at least one track comprises a main-IDT, wherein said main-IDT comprising by an inter-digital transducer.

21. An aggregated wave-guide comprising at least two parallel zebra-wave-guides, wherein at least two said parallel zebra-wave-guides have different quantities of isolated electrode fingers.

22. An aggregated wave-guide, according to claim 21, wherein said zebra-wave-guides differ in width, i.e. in length of fingers of which said zebra-wave-guides consist.

23. A method for control of a SAW beam front's time delay and/or phase shift, said method is based on the mechanism of dependency of SAW wave-number on the electrical load condition: either isolated or electrically shorted fingers comprising a varying of a quantity of isolated electrode fingers taking place within a zebra-waveguide structure; wherein the relative phase shift between wave fronts of SAW beams propagating through different said zebra-wave-guides of an aggregated wave-guide, according to claim 21, is achieved by manipulation of quantities of isolated fingers in said different zebra-wave-guides.

24. A method for a SAW beam transformation, said method comprising:
   (a) division of a wide SAW beam into a set of separated narrow SAW beams of different width by applying a plurality of parallel SAW zebra-wave-guides, wherein said narrow SAW beams are relatively weighted by widths of said zebra-wave-guides; and
   (b) controlling a SAW beam fronts' time-delay and/or phase, according to the method of claim 23.

25. A method for achieving a phase alignment in a wide frequency range for construction having MSC based on utilization of both an MSC-effect and the effect of the relative phase shift between two SAW beams propagating along two parallel zebra-wave-guides having interdigitized fingers arrays with a different quantity of isolated fingers, wherein said method comprises:
   (a) implementing of an MSC, having at least two separated parallel SAW tracks; and
   (b) implementing of at least two parallel zebra-wave-guides, having different quantities of isolated fingers, in order to align phase fronts of two beams, propagating through said two parallel SAW tracks.

26. A method for improving an IDT characteristics by deriving a narrow SAW track and constructing a combined-IDT topology comprising:
   (a) calculating an original apodized IDT topology having a lot of small overlaps, in assumption of absence of the diffraction spreading effect;
   (b) deriving a narrow track, having a lot of small overlaps, from said original apodized IDT;
   (c) implementing said derived narrow track as a separate narrow SAW IDT-wave-guide, wherein said IDT-wave-guide has weighted topology that calculated to generate the same contribution to electrical characteristics as said derived narrow track, having a lot of small overlaps, in assumption of absence of the diffraction spreading effect;
   (d) implementing a separated SAW main-IDT as a cannibalized apodized IDT assembled from remainder original IDT after deriving said narrow track, wherein said main-IDT has weighted topology that calculated to generate such a contribution to electrical characteristics that is equal to differ between the contribution of said original apodized IDT and the contribution of said IDT-wave-guide, comprising said derived narrow track; and
   (e) connecting said main-IDT and said IDT-wave-guide in parallel, whereby forming said combined-IDT topology.

27. A method for obtaining a phase-anisotropy of a bi-directional IDT comprising a combination of a bi-directional IDT and a pair of zebra-wave-guides having different quantities of isolated fingers, wherein said bi-directional IDT is arranged between the two zebra-wave-guides, and wherein the two zebra-wave-guides have different quantities of isolated electrode fingers, thereby causing the SAW beams to propagate through the opposing zebra-waveguides with different wave-numbers, thus defining an additional relative phase shift between propagating fronts of the SAW beams, propagating on opposite sides of said bi-directional IDT.

28. A method according to claim 27 for obtaining a quadrature-phase anisotropy of bi-directional IDT, wherein said difference of quantities of isolated fingers is adapted for providing the opposing SAW beams, flowing out of the respective said zebra-wave-guides, get additional relative 90-degree phase shift; wherein use of either a symmetrical or an antisymmetrical bi-directional IDT in the structure leads to the quadrature phase-anisotropy of the bi-directional IDT.

29. A method for obtaining an amplitude anisotropy of a bi-directional IDT by a combination of an effect of interaction of SAW waves in a U-type 3 dB MSC and an effect of relative phase shifting between phase fronts of SAW beams propagating through zebra-wave-guides, having different quantities of isolated fingers; wherein the combining comprises:
  (a) realizing a phase anisotropy of bi-directional IDT by a method, according to claim 27, whereby obtaining a phase-anisotropic bi-directional IDT;
  (b) combining said phase-anisotropic bi-directional IDT and a U-type 3 dB MSC, wherein said phase-anisotropic bi-directional IDT is arranged between arms of a U-type 3 dB MSC, that provides said anisotropic IDT's anisotropic directivity for launched and detected SAW waves; wherein, if said different quantities of isolated fingers provide the 90-degree relative phase shift between fronts of SAW beams, propagating on opposite sides of said bi-directional IDT, said phase-anisotropic bi-directional IDT turns into quadreture-phased bi-directional IDT and said anisotropic IDT turns into quadrature-anisotropic IDT, having the following amplitude anisotropic property: each of said bi-directional IDT topology components: symmetrical and antisymmetrical—launch and/or detect only one of opposite SAW beams.

30. A method for achieving unidirectionality in the wide frequency range of the original bi-directional IDT comprising:
  (a) calculating a bi-directional inter-digital transducer topology;
  (b) decomposing said bi-directional inter-digital transducer topology on the pair: symmetrical and antisymmetrical bi-directional IDT topologies, having and antisymmetrically respectively, wherein this step becomes trivial if the original said bi-directional IDT topology is initially either symmetrical or antisymmetrical;
  (c) realizing an amplitude anisotropy for both: symmetrical and antisymmetrical bi-directional—IDTs by a method, according to claim 29, whereby obtaining positive and negative quadrature-anisotropic bi-directional IDTs, comprising said symmetrical and antisymmetrical bi-directional IDTs respectively, wherein, said different quantities of isolated fingers of zebra-waveguide provide the 90-degree relative phase shift between fronts of SAW beams, propagating on opposite sides of said symmetrical and antisymmetrical bi-directional IDTs, whereby said positive and negative quadrature-anisotropic bi-directional IDTs turn into positive and negative unidirectional-in-wide-frequency-range IDTs respectively; and
  (d) cascading of both said positive and negative unidirectional-in-wide-frequency-range transducers; wherein said positive unidirectional-in-wide-frequency-range transducer and said negative unidirectional-in-wide-frequency-range transducer are connected in parallel and arranged in two parallel tracks by such a manner that provides launching and detecting SAW waves, which propagate on the same side of said unidirectional-in-wide-frequency-range transducer; wherein this step becomes irrelevant, if the original said bi-directional inter-digital transducer topology is initially either symmetrical or antisymmetrical.

31. A method for improving IDT characteristics by constructing a partially-unidirectional-combined-IDT topology having both a unidirectional main part and bi-directional narrow part of the IDT, wherein the construing comprises:
  (a) calculating an original apodized IDT topology having a lot of small overlaps, in assumption of absence of the diffraction spreading effect;
  (b) deriving a narrow track, having a lot of small overlaps, from said original apodized IDT;
  (c) implementing said derived narrow track as a separate narrow SAW IDT-wave-guide, wherein said IDT-waveguide has weighted topology that calculated to generate the same contribution to electrical characteristics as said derived narrow track, having a lot of small overlaps, in assumption of absence of the diffraction spreading effect;
  (d) implementing a separated SAW main-IDT as a cannibalized apodized IDT assembled from remainder original IDT after deriving said narrow track, wherein said main-IDT has weighted topology that calculated to generate such a contribution to electrical characteristics that is equal to differ between the contribution of said original apodized IDT and the contribution of said IDT-wave-guide, comprising said derived narrow track;
  (e) connecting said main-IDT and said IDT-wave-guide in parallel, whereby forming a combined-IDT topology;
  (f) achieving a unidirectivity in wide frequency range of original bi-directional IDT, according to claim 30, that applied to said main-IDT, by transforming said main-IDT to unidirectional-in-wide-frequency-range IDT; and
  (g) doubly reducing an aperture of said unidirectional-in-wide-frequency-range transducer in order to remain a magnitude ratio between a SAW IDT-wave-guide, taking place into the structure of said combined-IDT, and said unidirectional-in-wide-frequency-range transducer.

32. A method for miniaturization of a SAW filter topology comprising:
  (a) improving both input and output IDTs' characteristics by constructing partially-unidirectional-combined-IDT topologies for the both input and output IDTs, according to claim 31;
  (b) arranging said input and output partially-unidirectional-combined-IDT in series, wherein corresponding said unidirectional-in-wide-frequency-range IDTs as well as corresponding said IDT-wave-guides are arranged in series respectively, wherein this said in series arrangement takes into account the fact that in this case, on the one hand, SAW waves, which are launched by interdigitized fingers of apodized said main-IDT topology, twice propagate through U-type 3-dB MSC, thereby, transforming a non-uniform SAW beam front to uniform one, and reach with already the uniform SAW beam front another said main-IDT's apodized interdigitized fingers, and on the other hand, the launching and detecting said narrow IDT-wave-guides of small aperture have quasi-uniform front of SAW beam, propagating there, because of waveguide effect, so there is no necessary to use MSC in such a narrow track; and (c) reducing the distance between the two said partially-unidirectional-combined-IDT topologies observing an engineering rule that the distance should not be less than 1.5 of corresponding aperture, in order to substantially avoid a signal leakage effect; wherein, observing the engineering rule, the distance may be reduced in principal, because an aperture of said narrow IDT-wave-guide is more less than an aperture of said original apodized IDT topology.

33. A one-channel zebra-wave-guide implemented as an array of interdigitized electrode fingers, wherein said array comprises:

(a) at least one inter-finger connector, providing electrical shorting of interdigitized electrode fingers, wherein said inter-finger connector is arranged either within and/or outside of said array, wherein size of said inter-finger connector is substantially small in direction perpendicular to direction of a SAW beam propagation, wherein said size is less than half a $\lambda$, where $\lambda$ is a SAW wave-length at a desired frequency;

(b) borders on both sides along direction of said SAW beam propagation, wherein each of said borders comprises a substantially wide free surface, wherein said substantially wide tree surface is wider than half of said $\lambda$; and (c) at least two interdigitized electrode fingers, which are periodically-adapted arranged for providing compensation of partial SAW waves reflected from said at least two interdigitized electrode fingers at said desired frequency.

34. A multi-track SAW wave coding device topology comprising at least one SAW interdigital transducer overlapping at least two SAW tracks, wherein at least one of said at least two SAW tracks comprises:
a SAW reflector;
a SAW wave-guide; and
a SAW phase shifter;

and wherein said reflector represents a SAW zebra waveguide, having fingers arranged with a periodicity adapted for providing in-phase summing of partial SAW waves reflected from said fingers at a desired frequency, and wherein said SAW wave-guide represents a zebra-waveguide, having fingers arranged with a periodicity adapted for providing compensation for SAW wave reflections from said fingers at a desired frequency, whereby the SAW wave propagates along said waveguide substantially with no diffraction spreading due to a wave-guide effect, and wherein said SAW phase shifter, having fingers arranged with a periodicity adapted for providing compensation for SAW wave reflections from said fingers at a desired frequency, provides coding of said at least one of said at least two SAW tracks, and wherein said coding comprises changing the resulting phase shifter electrical loading, which provides a delay-defined phase shift of the SAW wave, propagating throughout said at least one of said at least two SAW tracks, such that said at least one of said at least two SAW tracks is coded by the phase shift.

35. A multi-track SAW wave coding device topology according to claim 34, wherein said changing of a resulting electrical loading of said phase shifter is achieved by implementing said phase shifter in two stages:

implementing at least one pair of fragments having equal length and differing by electrical load, such that one fragment of the pair consists of isolated fingers and the other fragment consists of electrically shorted fingers; and removing one of the fragments of the at least one pair of fragments.

36. A multi-track SAW wave coding device topology according to claim 34, wherein said SAW reflector comprises a reflecting grating consisting of reflecting fingers.

37. A multi-track SAW wave coding device topology according to claim 34, wherein said SAW reflector comprises a wide spectrum SAW mirror implemented as U-Type 3 dB MSC.

* * * * *